United States Patent
Park

(10) Patent No.: US 11,427,913 B2
(45) Date of Patent: Aug. 30, 2022

(54) METHOD AND APPARATUS FOR GENERATING HIGHLY REPETITIVE PULSED PLASMAS

(71) Applicant: PlasmaNano Corporation, La Jolla, CA (US)

(72) Inventor: Jaeyoung Park, La Jolla, CA (US)

(73) Assignee: PlasmaNano Corporation, La Jolla, CA (US)

( * ) Notice: Subject to any disclaimer, the term of this patent is extended or adjusted under 35 U.S.C. 154(b) by 381 days.

(21) Appl. No.: 15/648,198

(22) Filed: Jul. 12, 2017

(65) Prior Publication Data

US 2017/0311431 A1    Oct. 26, 2017

Related U.S. Application Data

(62) Division of application No. 13/860,393, filed on Apr. 10, 2013, now abandoned.
(Continued)

(51) Int. Cl.
*C23C 16/515* (2006.01)
*H05H 1/46* (2006.01)
(Continued)

(52) U.S. Cl.
CPC ........ *C23C 16/515* (2013.01); *C23C 16/0245* (2013.01); *C23C 16/452* (2013.01);
(Continued)

(58) Field of Classification Search
None
See application file for complete search history.

(56) References Cited

U.S. PATENT DOCUMENTS

| 3,296,410 A | 1/1967 | Hedger |
| 3,995,138 A | 11/1976 | Kalev et al. |

(Continued)

FOREIGN PATENT DOCUMENTS

| WO | WO 2002/075801 | 9/2002 |
| WO | WO 2010027959 | 3/2010 |

OTHER PUBLICATIONS

Deilmann, Michael, et al., *Pulsed microwave plasma polymerization of silicon oxide films: application of efficient permeation barriers on polyethylene terephthalate*, Surface and Coatings Technology, Aug. 15, 2007 (18 pages).
(Continued)

*Primary Examiner* — Jiong-Ping Lu
(74) *Attorney, Agent, or Firm* — DLA Piper, LLP US

(57) ABSTRACT

A pulsed radio frequency inductive plasma source and method are provided. The source may generate plasma at gas pressures from 1 torr to 2000 torr. By utilizing high power RF generation from fast solid state switches such as Insulated-Gate Bipolar Transistor (IGBT) combined with the resonance circuit, large inductive voltages can be applied to RF antennas to allow rapid gas breakdown from 1-100 μs. After initial breakdown, the same set of switches or an additional rf pulsed power systems are utilized to deliver large amount of rf power, between 10 kW to 10 MW, to the plasmas during the pulse duration of 10 μs-10 ms. In addition, several methods and apparatus for controlling the pulse power delivery, timing gas and materials supply, constructing reactor and substrate structure, and operating pumping system and plasma activated reactive materials delivery system will be disclosed. When combined with the pulsed plasma generation, these apparatuses and the methods can greatly improve the applicability and the efficacy of the industrial plasma processing.

1 Claim, 23 Drawing Sheets

Related U.S. Application Data

(60) Provisional application No. 61/801,131, filed on Mar. 15, 2013.

(51) Int. Cl.

| | | |
|---|---|---|
| *C23C 16/452* | (2006.01) | |
| *C23C 16/453* | (2006.01) | |
| *C23C 16/455* | (2006.01) | |
| *H01J 37/32* | (2006.01) | |
| *C23C 16/02* | (2006.01) | |
| *C23C 16/505* | (2006.01) | |
| *H01L 21/3065* | (2006.01) | |

(52) U.S. Cl.
CPC ...... *C23C 16/453* (2013.01); *C23C 16/45557* (2013.01); *C23C 16/505* (2013.01); *H01J 37/321* (2013.01); *H01J 37/3211* (2013.01); *H01J 37/32082* (2013.01); *H01J 37/32146* (2013.01); *H01L 21/3065* (2013.01); *H05H 1/46* (2013.01); *H05H 1/4652* (2021.05); *H05H 2242/20* (2021.05)

(56) References Cited

U.S. PATENT DOCUMENTS

| | | | |
|---|---|---|---|
| 4,246,465 A | 1/1981 | Ericsson | |
| 5,942,855 A | 8/1999 | Hopwood | |
| 5,949,193 A | 9/1999 | Roine et al. | |
| 6,291,938 B1 | 9/2001 | Jewett et al. | |
| 6,589,437 B1 * | 7/2003 | Collins | H01J 37/321 216/67 |
| 6,858,112 B2 | 2/2005 | Flamm et al. | |
| 6,919,527 B2 | 7/2005 | Boulos et al. | |
| 6,994,837 B2 | 2/2006 | Boulos et al. | |
| 7,000,565 B2 | 2/2006 | Fukuda et al. | |
| 8,013,269 B2 | 9/2011 | Boulos et al. | |
| 8,092,570 B2 | 1/2012 | Boulos et al. | |
| 8,692,467 B2 | 4/2014 | Benjamin et al. | |
| 2002/0076490 A1 | 6/2002 | Chiang | |
| 2002/0114897 A1 | 8/2002 | Sumiya et al. | |
| 2002/0185226 A1 | 12/2002 | Lea et al. | |
| 2003/0232513 A1 | 12/2003 | Kraus et al. | |
| 2005/0163696 A1 | 7/2005 | Uhm et al. | |
| 2008/0011426 A1 | 1/2008 | Chua | |
| 2009/0280268 A1 | 11/2009 | Glukhoy et al. | |
| 2010/0027959 A1 | 3/2010 | Casey et al. | |
| 2010/0166815 A1 | 7/2010 | Mailley et al. | |
| 2012/0261390 A1 | 10/2012 | Boulos et al. | |
| 2012/0285481 A1 * | 11/2012 | Lee | C23C 16/0245 134/1.1 |
| 2013/0189446 A1 | 7/2013 | Casey et al. | |

OTHER PUBLICATIONS

Deilmann, Michael, Grabowski, Mirko, Theiß, Sebastian, Bibinov, Nikita, and Awakowicz, Peter, *Permeation mechanisms of pulsed microwave plasma deposited silicon oxide films for food packaging applications*, J. Phys. D: Appl. Phys. 41 (2008) 135207 (7 pages).

Du, D., et al., *Laser-induced breakdown by impact ionization in $SiO_2$ with pulse widths from 7 ns to 150 fs*, Applied Physics Letters, vol. 64, 3071, 1994 (3 pages).

Macheret, S., et al., *Modeling of Air Plasma Generation by Repetitive High-Voltage Nanosecond Pulses*, IEEE transactions on plasma sciences, vol. 30, 1301, Jun. 2002 (14 pages).

Owner's Manual—CS600S/13.56MHz RF Generator © 2003 by Comdel, Inc. (19 pages).

Park, Jaeyoung, et al., *An atmospheric pressure plasma source*, Applied Physics Letter, vol. 76, 288, 2000 (3 pages).

Raizer, Yuri P., Shneider, Mikhail N., and Yatsenko, Nikolai A., *Radio-Frequency Capacitive Discharges*, © 1995 CRC Press, Inc. ISBN 0-84938-644-6 (302 pages).

Rao, N., et al., *Nanoparticle Formation Using a Plasma Expansion Process*, Plasma Chemistry and Plasma Processing, vol. 15, No. 4, 1995 (26 pages).

Stix, Thomas Howard, *Waves in Plasmas*, © 1992 Springer-Verlag New York, Inc., ISBN 0-88318-859-7 (579 pages).

Website: Tekna Plasma Systems Inc., Sherbrooke, Quebec, Canada (www.tekna.com) printed Apr. 9, 2013 (9 pages).

PCT International Search Report of PCT/US14/26628; dated Sep. 19, 2014 (3 pgs.).

PCT Written Opinion of the International Searching Authority of PCT/US14/26628; dated Sep. 19, 2014 (12 pgs.).

\* cited by examiner

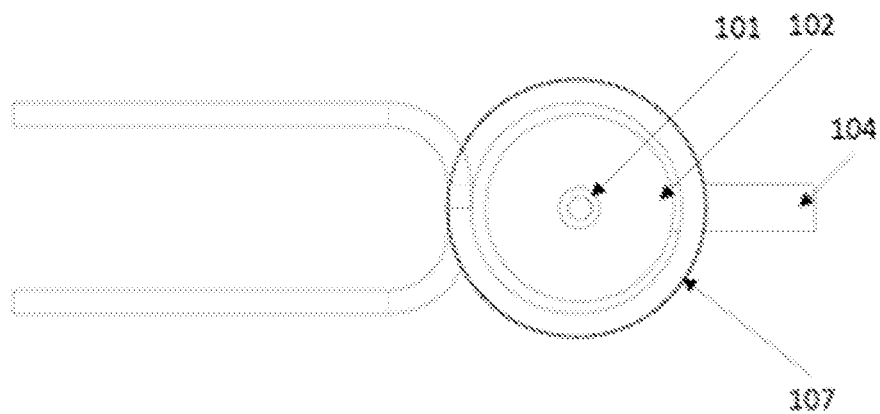
FIGURE 1B1
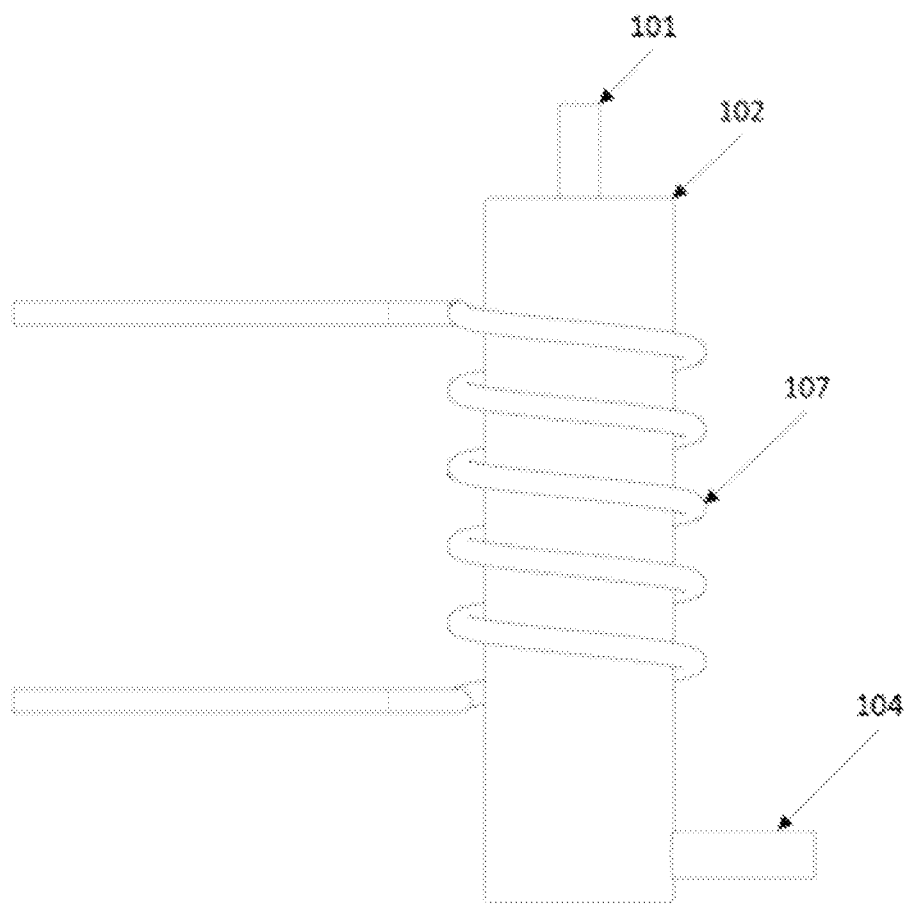
FIGURE 1B2

FIGURE 6B1
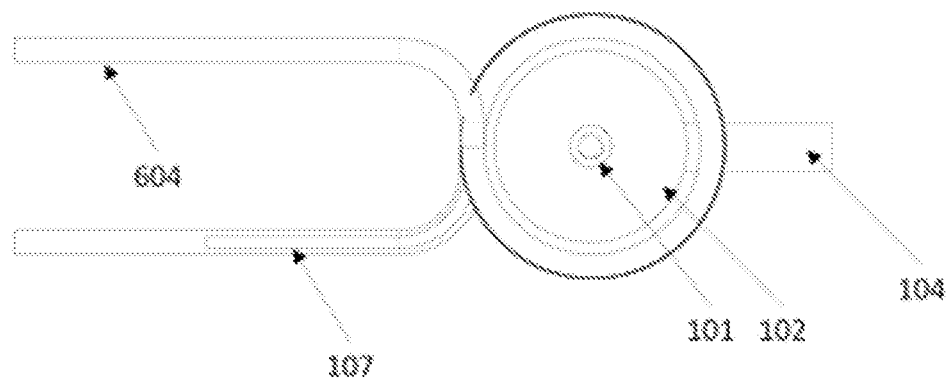
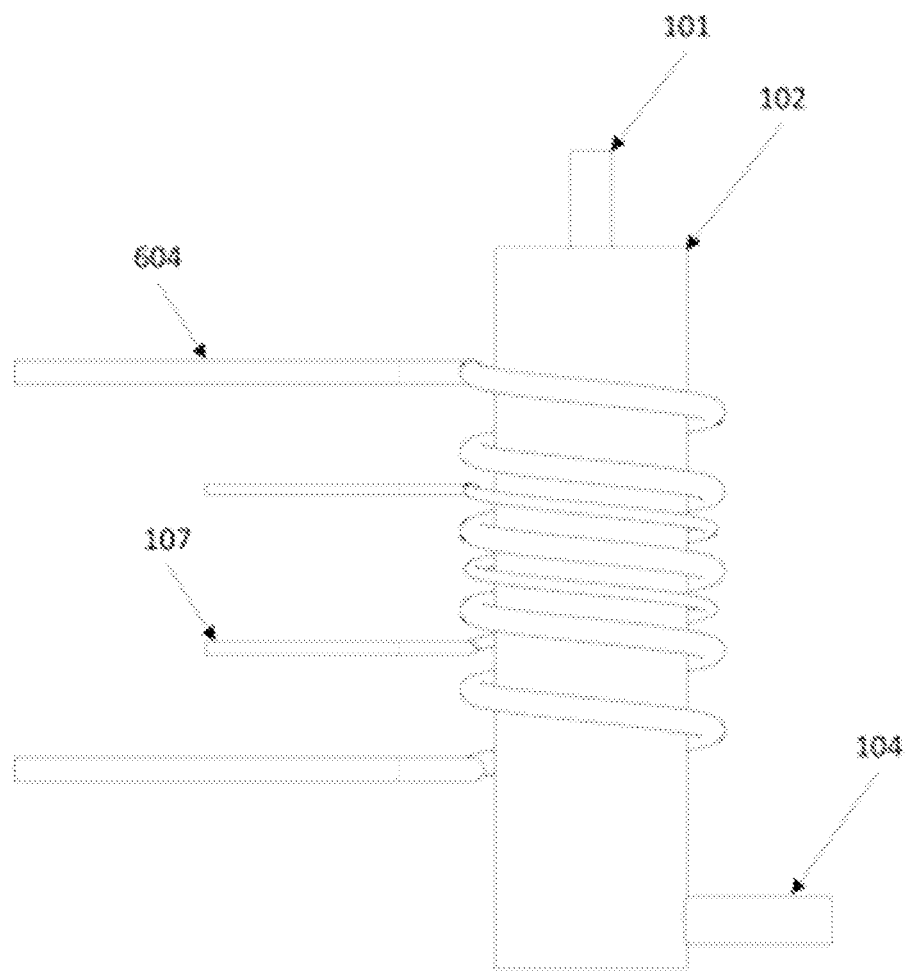
FIGURE 6B2

METHOD AND APPARATUS FOR GENERATING HIGHLY REPETITIVE PULSED PLASMAS

RELATED CASES/PRIORITY CLAIMS

This application claims priority under 35 USC 120 and is a divisional of U.S. patent application Ser. No. 13/860,393, filed Apr. 10, 2013 and titled "Method and Apparatus for Generating Highly Repetitive Pulsed Plasmas" that is turn claims the benefit under 35 USC 119(e) to U.S. Provisional Patent Application Ser. No. 61/801,131, filed on Mar. 15, 2013 and entitled "Method and Apparatus for Generating Highly Repetitive Pulsed Plasmas", the entirety of both of which are incorporated herein by reference.

APPENDIX

Appendix A (6 pages) is a listing of the numbered elements in the diagrams. Appendix A forms part of the specification and is incorporated herein by reference.

FIELD

The disclosure is related to the highly repetitive radio frequency pulsed inductive plasma generation at high gas pressures. In addition, the disclosure is related to the operation of said pulsed plasma system in its applications to the materials processing such as nano scale material manufacturing, toxic chemical processing, plasma assisted material deposition and coating, surface removal, surface activation and surface property modification. The pulsed plasma system may also be used for nanodevice fabrication such as the selected activation, deposition, removal of nanomaterials such as nanowires, nanoparticles, quantum dots, nanophosphors—on different substrates and surfaces.

BACKGROUND

Plasma processing has been used in many industrial applications such as plasma etching, thin film deposition, ion implantation, surface modification, and others due to its ability to convert electrical power into superior chemical/thermal reactivity. While plasma device operates in a wide range of gas pressures, the majority of plasma sources have been operated in a vacuum or at low gas pressure. A plasma device may use radio frequency (RF) power to generate the plasma and there are many different plasma sources such as RF capacitive discharge, RF inductive discharge, transformer coupled plasmas (TCP), and helicon sources that can operate in the low gas pressure condition. While these plasma sources have been successfully utilized in semiconductor chip manufacturing and vacuum thin film coating, the low gas pressure operation has limited the use of plasma tools to situations in which a high throughput is not critical. In comparison, many industrial processes requires the material processing throughput to be on the order of hundreds of grams per hour or square meters per minute. Furthermore, in the case of nanotechnology applications, a high rate of reactive radical generation is critical for industrial scale process due to a large surface area of nanomaterials. Because the low pressure plasma source starts with a smaller number of molecules, the reactive species generation is limited and the reaction throughput is difficult to scale up.

One way to overcome the throughput issue is to utilize a plasma source that operates at high gas pressures between 1 torr and 2,000 torr. For example, RF inductive plasma generation at atmospheric pressure has been around since 1960s. In addition, DC and AC arc plasmas operate at atmospheric pressure range and are used for thermal plasma spray, arc welding, arc deposition and others type of applications requiring high thermal reactivity. The technical challenge of these high pressure plasma sources arc their inherent tendency to operate at a high gas temperature at 2,000 C or higher when the input power level is increased to above 10 W/cc level in order to increase the reactive species generation and to achieve high throughput. In the case of RF high pressure discharge, well known alpha-to-gamma state transition highlights this tendency. This is due to the fact of very high collision rates between the electrons and the gas molecules (described in Alpha to Gamma mode transition: "Radio-Frequency Capacitive Discharges", by Yuri P. Raizer and Mikhail N. Shneider, CRC Press, 1995) resulted in eventual gas heating to high temperature. As such, applications of plasma sources operating at high gas pressure have been limited to high temperature materials processing. Arc deposition can provide high quality coating such as Titanium nitride on to metal cylinders but not on to the flexible polymer surface.

If the plasma operation is in steady-state, the only ways to limit and control the gas heating by plasma are to use fast gas flow to limit the time that the gas spends in the plasma volume or to deploy actively cooled plasma facing components to set up a thermal loss boundary as described in U.S. Pat. No. 8,013,269 and "An atmospheric pressure plasma source", by Jaeyoung Park, I. Henins, H. Herrmann, and G. Selwyn, J. Jeong, R. Hicks, D. Shim and C. Chang, Applied Physics Letter, Volume 76, 288, 2000. For a small-scale system, it may be possible to utilize these two methods to alleviate the inherent plasma gas heating problem. However, to scale up of these methods to alleviate the plasma gas heating problem become too complex and costly if a large scale system is considered. Specifically, fast gas flow system requires expensive gas recovery system. In addition, it is challenging to maintain uniform transit time across the entire plasma reactor volume. Furthermore, the heating rate will increase by volume while the loss boundary will increase only by surface area. Thus, as the system size is increased, a complex and costly cooling system is required in order to maintain its stable operation and to reduce the thermal damage to plasma facing components.

In scholarly articles, there has been some amount of work on generating pulsed plasmas in high gas pressures including the pulsed DC arc, pulsed microwave and even pulsed laser plasma generation. For example, see U.S. Pat. No. 3,995,138; "Pulsed microwave plasma polymerization of silicon oxide films: Application of efficient permeation barriers on polyethylene terephthalate", by Michael Deilmann, Sebastian Theiβ, Peter Awakowicz, Surface and Coatings Technology, Volume 202, 1911, 2008; and "Laser-induced breakdown by impact ionization in SiO2 with pulse widths from 7 ns to 150 fs", D Du, X Liu, G Korn, J Squier, and G Mourou, Applied Physics Letters, Volume 64, 3071, 1994. However, highly repetitive pulsed RF plasma generation has not been pursued due to the difficulty of coupling proper RF power to the plasmas for short period with high repetition rates.

There are two main reasons for this. The first reason is a physics issue. The collisions between plasma particles (i.e. ions and electrons) and the neutral gas particles become very frequent at high gas pressure. For example, at 10 torr of argon gas, electron-argon elastic collision frequency is about 26 GHz. As a result, electrons are not magnetized in general at such high gas pressure. At 10 torr of argon, electron-argon collisions are too frequent for electrons to complete even one cyclotron motion between collisions unless the magnetic field strength exceeds 1 Tesla, which is hard to generate in a large volume. Under the non-magnetized electrons at high gas pressure condition, most of plasma waves cannot be excited due the collisional damping with neutral gas. The only allowable plasma waves are Langmuir wave (or plasma oscillation) for electrons, ion acoustic wave (or sound wave) for ions and electromagnetic light wave as described in "Waves in Plasmas" by Thomas Stix, Springer, 1992. Since none of those waves are easily usable for power coupling from externally applied RF fields to the plasmas, the high gas pressure conditions make the RF inductive plasma generation technically challenging. In comparison, DC/AC arcs utilize physical electrodes to generate the plasma, thus a lack of available plasma waves is not an issue.

The second reason is engineering and technology in nature. Specifically, there is a lack of readily available high power RF power supplies and RF tuning systems to deliver very large power to antenna for very short period of time. Typical RF power generator operates at 13.56 MHz and delivers the steady-state power output of 1-10 kW into 50 ohm load. This means that a typical RF power system operates with the maximum current rating of 10-20 A and the maximum voltage 500-1000V. Since the resonance circuits, whether in parallel or in series, can only increase either current or voltage but not both at the same time, it is technically challenging to initiate or to sustain high power coupling to plasma above 10 kW, especially for a short pulse duration of less than 10 ms which complicates adjustment in the tuning circuit. In addition, as will be discussed in the experimental section, the time lag to initiate the gas breakdown from the RF power onset increases from less than 1 microsecond to 100 microseconds or more with increasing gas pressure for a fixed antenna voltage and current. In the case of a plasma source operating in argon gas, the necessary EMF voltage is approximately 500 V per centimeter of reactor circumference at 10 torr for a reactor size of 5 centimeter diameter. Since these level of EMF voltage cannot be easily generated by readily available RF power generator and the available tuning circuit, a different approach is necessary to initiate, maintain and control the highly repetitive short pulse RF plasmas at high gas pressures.

BRIEF DESCRIPTION OF THE DRAWINGS

FIGS. 1B1 and 1B2 are a top view and a side view, respectively, of the radio frequency pulsed inductive plasma reactor in FIG. 1;

FIG. 2 illustrates another embodiment of the radio frequency pulsed inductive plasma reactor;

FIGS. 6B1 and 6B2 are a top view and side view, respectively, of the plasma reactor in FIG. 6A;

DETAILED DESCRIPTION OF ONE OR MORE EMBODIMENTS

Figure 1A:
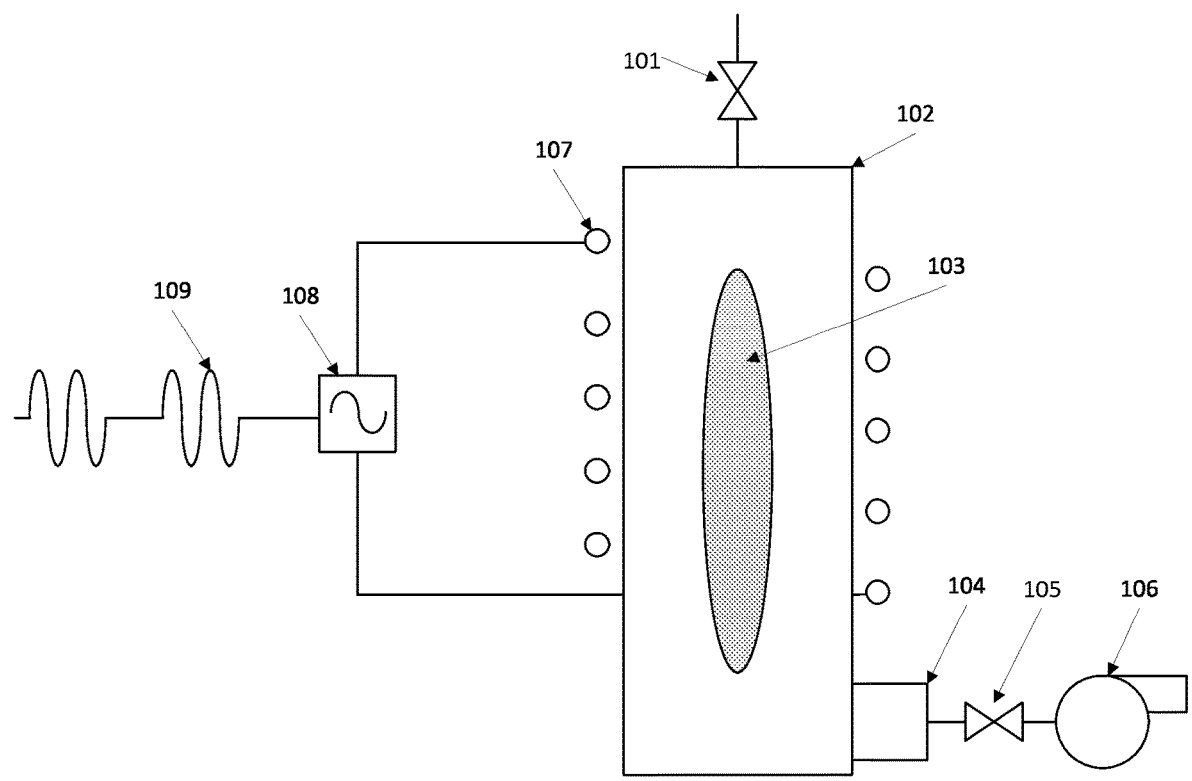
FIG. 1A illustrates an embodiment of a radio frequency pulsed inductive plasma reactor.

The disclosure is particularly applicable to pulsed RF inductive plasma system and method and it is in this context that the disclosure will be described. It will be appreciated, however, that the system and method has greater utility since it may be used for materials processing such as nano scale material and device manufacturing, toxic chemical processing, plasma assisted material deposition and coating, surface removal, surface activation and surface property modification. In addition, the pulsed plasma system may also be used for nanodevice fabrication such as the selected activation, deposition, removal of nanomaterials, such as nanowires, nanoparticles, quantum dots, nanophosphors, on different substrates and surfaces. The nanodevice fabrication may be done on surfaces including Silicon, SiC, AlN, GaN, Sapphire as well as glass, plastics, polymers, fabric, paper, fiberglass, composite materials, metals and alloys. The nanodevices may be formed on both flexible and rigid substrate and surfaces. Furthermore, porous and absorbent materials may be used as well as solid materials.

A pulsed RF plasma source described below may limit the duration of energy transfer between the plasma electrons at 1-10 eV range to the gas molecules by directly controlling the plasma source duration. For example, the range of pulse duration may be 10 μs-10 ms. Though the collision frequency between the electrons and the gas molecules is frequent, as much as 26 GHz at 10 torr of Argon gases, the efficiency of energy transfer rate is reduced due to a large mass difference between the electron and the argon atom. As such, the gas molecule heating caused by electron can be limited and controlled by such pulse duration. In addition, the heat transfer from the plasmas including the electrons and the heated molecules to the surrounding structure is gradual and requires sufficient time to build up the thermal effects. By keeping the pulse duration less than 10 ms, the thermal effects to the plasma facing components are greatly reduced. By repetitively pulsing the RF plasma operation at 1 Hz to 1,000 Hz, it is then possible to limit the thermal problems without sacrificing the desired reaction throughput.

The pulsed radio frequency (RF) inductive plasma source operating at high gas pressures has advantages over conventional steady-state RF plasma sources with improved efficiency of generating plasma reactivity and with reduced thermal damages to plasma facing components. Since a high reaction throughput is critical for industrial applications of plasma source for materials processing including nanotechnology applications, it is beneficial to generate pulsed RF plasma at gas pressures from 1 torr to 2,000 torr and preferable from 5 torr to 2,000 torr, resulting in high plasma densities between $10^{15}$ cm$^{-3}$ and $10^{17}$ cm$^{-3}$ during the pulse. At such plasma densities, plasmas can generate copious amounts of reactive radicals from a wide range of precursor materials by rapid thermal, chemical and electrical energy transfer from plasma electrons to the precursor materials. In comparison, many of the RF inductive plasmas used at semiconductor materials processing operates from 1 mtorr to 50 mtorr pressure range with the plasma density between $10^{10}$ cm$^{-3}$ and $10^{12}$ cm$^{-3}$, resulting in much lower reactivity than one available at high pressure plasma sources. At such high gas pressures, however, frequent collisions between plasma electrons and neutral gas molecules greatly limit the available modes of plasma wave propagation. Under this condition, it has been difficult to efficiently couple RF power into plasma in a short pulse mode, where the pulse duration is between 10 μs-10 ms. This particular range of pulse duration is important to materialise the key benefits of pulsed plasma operation. By utilizing high power RF generation from fast solid state switches such as Insulated-Gate Bipolar Transistor (IGBT) combined with the resonance circuit, large inductive voltages are applied to RF antennas to allow rapid gas breakdown from 0.1-100 μs. After initial breakdown, the same set of switches or additional RF pulsed power system is utilised to deliver large amount of RF power, between 10 kW to 10 MW, to the plasmas during the pulse duration of 10 μs-10 ms. In addition, several methods and apparatus of controlling the pulse power delivery, timing gas and materials supply, constructing reactor and substrate structure, and operating pumping system and plasma activated reactive materials delivery system will be disclosed. When combined with the pulsed plasma generation, these apparatuses and the methods can greatly improve the applicability and the efficacy of the industrial plasma processing.

Figure 2:
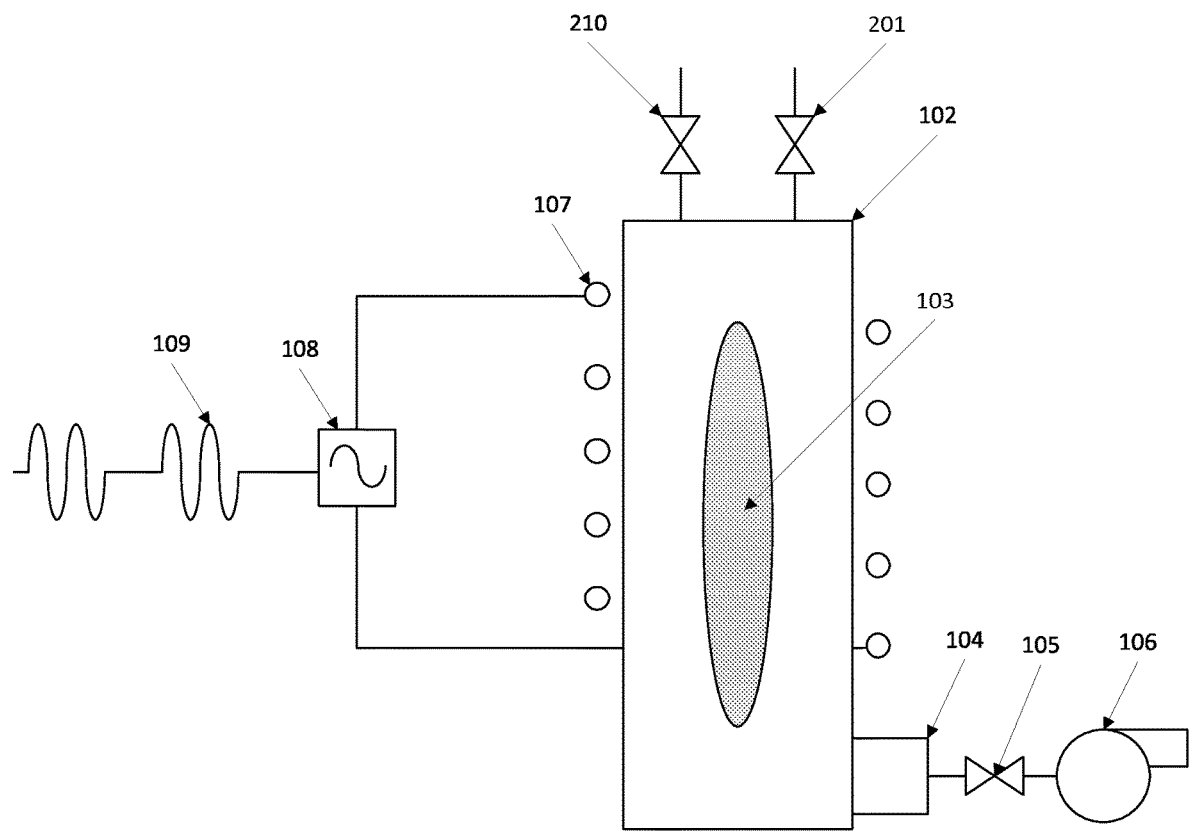
Figure 12:
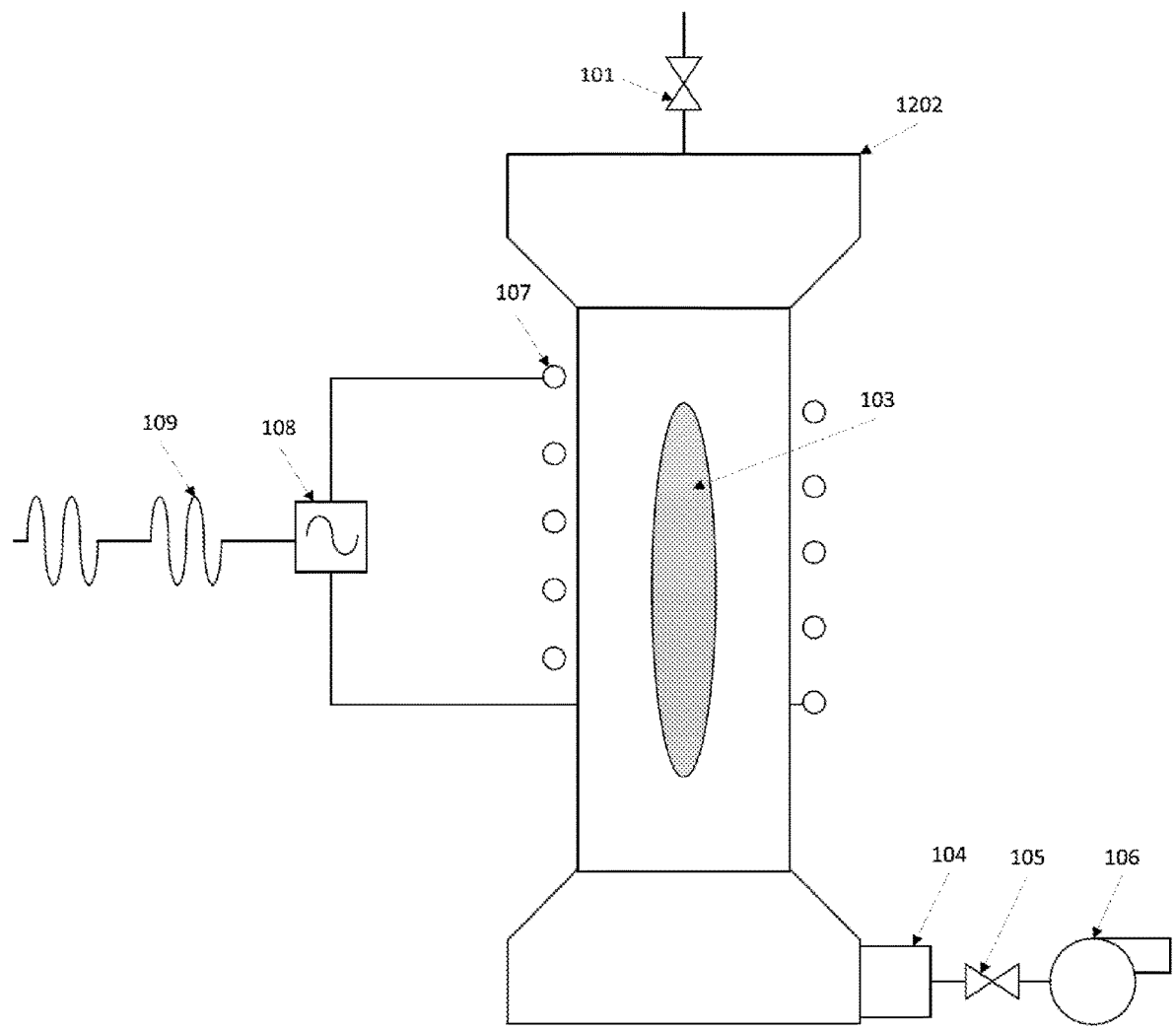
FIG. 12 illustrates an hourglass shaped reactor chamber embodiment of the pulsed plasma reactor.

FIG. 1A illustrates a first embodiment of a radio frequency pulsed inductive plasma reactor that generates an radio frequency inductive plasma at gas pressures from 1 torr to 2000 torr (and preferably from 5 torr to 2000 torr) and FIGS. 1B1 and 1B2 are a top view and a side view, respectively, of the radio frequency pulsed inductive plasma reactor in FIG. 1A. The reactor may have a reactor chamber 102 that may have a particular shape, such as a cylinder in FIG. 1B or an hourglass shape as shown in FIG. 12, and may also have an inlet region at one end and an outlet at an opposite end of the chamber. The reactor chamber may be of any shape and may be for example, square, rectangular, oval or a hexagon. In each of the embodiments, the reactor chamber may have a diameter of between 0.5 inches to 12 inches. The thickness of the walls of the reactor chamber may be 0.5 mm to 5 mm depending on the properties of the material used for the walls. The reactor chamber walls may also be made of two or more materials as long as a dielectric (non-metal) material is used adjacent the antenna. The reactor may also have a pulsed radio frequency generator that is coupled to the reactor chamber 102. The pulsed radio frequency generator may further include an antenna 107 and a pulsed radio frequency source 108 (that generates a pulsed signal 109) that is coupled to the antenna. The antenna 107 may surround a portion of the reactor chamber 102. In one implementation, the antenna 107 may be a multi-turn coil that encircles the portion of the reactor chamber 102 as shown in FIGS. 1A, 1B1 and 1B2.

The reactor may also have an inlet 101 that has an entry point for a carrier gas and one or more reactive precursors materials that are turned into a plasma in the reactor chamber. The reactor may also have a pressurizing system 104 that may be used to maintain the gas pressure in the reactor chamber. The pressuring system may further include a pump 106 and a valve 105. In this embodiment, any precursor material (a gas, a liquid or solid precursors) may be used and the pumping may be continuous or operated using a timed pulse. For example, the precursor material may be a solid precursor material having a linear size of between 10 nm to 0.1 mm and preferably a linear size larger than 10 nm and less than 0.1 mm. As another example, the precursor material may be a liquid precursor material having a linear size of between 10 nm to 0.1 mm and preferably a linear size larger than 10 nm and less than 0.1 mm. In one example, the one or more reactive precursor materials may be, for example, a reactive gas containing hydrogen, oxygen, nitrogen, fluorine, chlorine, sulfur, phosphor and hydrocarbon. In another example, the one or more reactive precursor materials may be acids, bases, polymers, metals, ceramics, and composite materials.

In operation, the carrier gas and the one or more reactive precursors may be introduced into the reactor chamber at the inlet 101 and the pressurizing system may maintain a pressure in the reactor chamber of 1 torr to 2000 torr. Then, a pulsed radio frequency signal is generated by the pulsed radio frequency source 108 and that signal is coupled to the antenna 107 which initiates a breakdown of the carrier gas and one or more reactive precursors and generates a plasma due to the breakdown of the carrier gas and one or more reactive precursors.

Thus, the reactor generates a pulsed plasma. The pulse plasma means that the duration of plasma generation is short compared to other relevant time scales for plasma source operation. Two specific time scales are chosen to define the pulse plasma operation. One is a time scale relevant to the thermal damage to the RF source structures without complex active cooling systems. Typically, the plasma generation involves significant heat generation in the plasma medium and subsequent heat transfer to surrounding structures, including but not limited to the antenna, an enclosure of the pulsed radio frequency generator, one or more walls of the reactor chamber, a substrate for surface treatment, nozzles in the inlet, a material collection system such as filter and collectors. By limiting the pulse duration of the plasma source operation, it is then possible to alleviate or eliminate cooling requirements to the affected surfaces, thus simplifying the engineering requirement and improving the reliability and overall power efficiency. In addition, the plasma reactor can operate to generate reactive plume onto various target surfaces for deposition, coating, surface removal, surface modification and treatment. By operating in pulsed manner, the amount of thermal energy per each pulse can be limited, so even thermally sensitive targets can be utilized. Examples will be plastics, polymers, fiberglass, fabric, ceramics, glass, and even papers as well as metals, alloys and composite materials. Specifically, the reactor 100 may implement a plasma pulse operation from 10 μs to 10 ms, where previous intermittent plasma source operation using RF power cannot adequately address due to the RF power supply and plasma coupling limitation.

The second time scale is the time scale relevant to a transit time of the gas flow across/through the plasma reactor. In most of the plasma processing applications, there is gas flow that carries precursor materials in various phases such as gas, liquid droplets, and solid particles into the plasma reaction volume. During their transit time passing through the plasma reaction volume (for example, in the portion of the reactor chamber that is surrounded by the antenna), the precursor materials receive thermal, chemical, electrical energies from the plasmas and undergo desirable reactions. In the case of steady-state plasmas operating at a fixed power level, the control of the precursor materials reactivity is governed by the gas flow speed, which is difficult to control precisely over the entire reaction volume as described in "Nanoparticle formation using a plasma expansion process", by N. Rao, S. Girshick, J. Heberlein, P. McMurry, S. Jones, D. Hansen, and B. Micheel, Plasma Chemistry and Plasma Processing, Volume 15, 581, 1995 that is incorporated herein by reference. Additionally, in the case of high power, high throughput plasma reactors, the gas flow needs to be very large, on the order of 100 liters per minute or more, in order to control the plasma reactivity that is described in U.S. Pat. No. 6,994,837 that is incorporated herein by reference. In comparison, the pulsed plasma operation allows reliable and accurate control of the precursor material reactivity by controlling the pulse duration, when the pulse duration is comparable or shorter than the gas transit time. In the case of gas flow moving at a speed of 1 m/s to 10 m/s, the typical transit time is about 1 ms to 10 ms for a 10 cm length plasma reactor. Thus, the pulse plasma operation from 10 μs to 10 ms provides simple and reliable control of the precursor material reactivity by regulating the thermal, chemical and electrical energy transfer from the plasmas.

Energy and Power Input During Pulses

At high gas pressure, even a modest reactor volume contains a large number of gas atoms and molecules that will get ionized and turned into a plasma. In the case of argon gas pressures at 5 torr and at 50 torr, the corresponding gas number densities are $1.4 \times 10^{17}$ $cm^{-3}$ and $1.4 \times 10^{18}$ $cm^{-3}$. For a plasma reactor volume of 100 $cm^3$, the amounts of gas atoms in the reactor are $1.4 \times 10^{19}$ and $1.4 \times 10^{20}$ respectively (or $2.3 \times 10^{-5}$ mole and $2.3 \times 10^{-4}$ mole). In order to generate plasmas, electrons need to provide sufficient energies to ionize the neutral gas. In the case of argon, this ionization energy is 15.8 eV for the first electron removal. In general, however, a plasma source requires typically 100 eV-500 eV of energy cost for ionization (1 eV=$1.6 \times 10^{-19}$ J) of one pair of an electron and an ion from a gas atom as described in "Modeling of Air Plasma Generation by Repetitive High-Voltage Nanosecond Pulses", by S. Macheret, M. Shneider, and R. Miles, IEEE transactions on plasma sciences, Volume 30, 1301, 2002 that is incorporated herein by reference. This is because there are many energy loss channels for electrons in the plasma system, in addition to ionization. The loss channels may include electron impact excitation followed radiation loss, electron loss to the surrounding boundary, and electron heating of neutral gas atoms by collisions. Assuming an energy budget of 150 eV, in order to ionize a 5% of gas in the reactor volume, an energy input from pulsed RF power system to the plasmas needs to be 17 J for the reactor volume of 100 $cm^3$ and a gas pressure of 5 torr, which results in the plasma density of $7 \times 10^{15}$ $cm^{-3}$. In the case of 50 torr gas operation, the amount of energy input needs to be 170 J for the reactor volume of 100 $cm^3$, which results in the plasma density of $7 \times 10^{16}$ $cm^{-3}$. For the pulse duration of 10 μs, the required pulse powers are 1.7 MW for 5 torr and 17 MW for 50 torr. For longer pulse duration of 1 ms, the required pulse powers are 17 kW for 5 torr and 170 kW for 50 torr. It is noted that additional input powers may be needed in order to generate thermal and chemical reactivity to the precursor materials, by raising temperatures of precursor materials, by dissociating and decomposing precursor materials and generating reactive radicals from precursor materials. As such, high RF power coupling to the plasma during the pulse is needed for the RF pulsed plasmas to be useful in plasma materials processing. In this disclosure, we are concerned with the RF powers between 10 kW and 10 MW during the pulse.

Precursor Materials

High power RF pulse plasmas can utilize a wide range of precursor materials. As shown above, the pulsed RF plasmas can generate very high plasma densities in the range of $10^{15}$ $cm^{-3}$ and $10^{17}$ $cm^{-3}$ during the pulse, if properly powered and controlled. These high plasma densities are what make the pulsed RF plasma reactor very attractive for a wide range of plasma applications. In comparison, typical plasma densities of vacuum based plasma sources such as RF ICP, RF TCP, and RF capacitive discharges are between $1 \times 10^{10}$ $cm^{-3}$ and $1 \times 10^{12}$ $cm^{-3}$. Separately, spatially averaged plasma densities are typically less than $1 \times 10^{10}$ $cm^{-3}$ in corona discharges and dielectric barrier discharges operating at atmospheric pressure. Atmospheric pressure glow discharges using RF or AC power typically operate up to $1 \times 10^{12}$ $cm^{-3}$ before collapsing into a localised gamma mode, where the plasma generation is limited into the current channel. At the operating densities in the range of $10^{15}$ $cm^{-3}$ and $10^{17}$ $cm^{-3}$, the pulsed rf plasmas in this invention have comparable plasma densities to various thermal plasmas such as DC arcs, AC arcs, and thermal induction plasma torches operating with rf power. It is noted that the operating mode of DC arcs, AC arcs and thermal induction plasma torches are either steady state or long pulse operation with the pulse duration much greater than 10 ms. For example, the thermal induction plasma torch is a mature technology producing the steady-state plasmas with densities in the range of $10^{14}$ $cm^{-3}$ and $10^{17}$ $cm^{-3}$, along with the gas temperatures between 3,000 C and 7,000 C, generating high thermal and chemical reactivity as described in Tekna Plasma Systems Inc., Sherbrooke, Quebec, Canada (www.tekna.com) which is incorporated herein by reference. The induction plasma torch has found niche industrial applications in nano-powder and nanomaterial synthesis using gas and solid precursor materials. However, the application of the induction plasma torch along with DC and AC arcs, has been severely limited due to its high temperature operation in steady state, which results in very large thermal load to the surrounding structures and limits its application to the plasma processing with the materials compatible with high temperature. In comparison, the pulsed RF plasma reactor can minimize inefficiencies and challenges related to high rate of heat generation and dissipation of the steady-state thermal discharges by utilizing short pulse plasma generation. On the other hand, as will be discussed shortly in the section, "Plasma Gas Heating", the pulsed RF plasma reactor operating with plasma densities, in the range of $10^{15}$ $cm^{-3}$ and $10^{17}$ $cm^{-3}$ and with input powers between 10 kW and 10 MW, can generate high gas temperature and associated high chemical reactivity comparable to those steady-state thermal plasmas during the pulse duration in a controlled manner. As such, the RF pulsed plasmas can utilize a wide range of precursor materials from reactive gases containing oxygen, nitrogen, fluorine, chlorine, sulfur, phosphor to hydrocarbon, acids, base, polymers, metals, ceramics, and composite materials in any phases of gas, liquid droplets and solid particles. Since the solid particle precursors up to 100 μm have been used in the induction thermal plasmas operating between 50 kW and 1 MW, it is projected that the similar particle size up to 100 μm can also be utilised in the pulsed rf plasma reactor.

The use of liquid droplets and solid particles as precursor materials are particularly useful for industrial applications for metal and high temperature ceramic and composite materials since it reduces or eliminates the use of highly toxic and reactive organometallic gas precursors. The use of liquid droplets and solid particles also reduces the processing complexities related to maintaining the proper chemical composition or stochiometry of the materials. For example, one of the challenges of the thin film solar cells using copper indium gallium selenide (CIGS) is the proper ratio among copper, indium, gallium and selenide during the deposition process. The pulsed plasma reactor allows the use of chemically complex precursor materials in its solid or liquid from for surface deposition and coating. The same is true for synthesis and applications of YAG (Yttrium aluminium garnet) phosphor. In addition, the pulsed operation of the pulsed RF plasma reactor provides a means to control the amount of activated precursors materials by controlling the energy transfer between the plasma electrons and the precursor materials using the pulse duration.

Separately, the high plasma density and subsequent high rate of reactive species generation is important in the area of nanotechnology including nanomaterial manufacturing and nano-device fabrication using plasmas. The key issue is large surface areas of the nano materials in the nanotechnology applications. Without high rates of reactive species generation, the nano-device fabrication utilizing selected activation, deposition, removal, and patterning of nano-materials and the structures cannot proceed at rate required for industrial scale. As such, low pressure plasmas and catalytic reaction path are not well suited for industrial scale nano-device fabrication, which is one of the reasons that nanotechnology adoption is still nascent in the industrial applications.

Pulsed Operation

Repetitive pulse operation is critical to ensure high thermal and chemical throughput of the plasma reactor. In general, a duty factor of the pulsed operation should be in the range of 1-10% level to maintain reasonable degree of throughput. For the pulse duration of 10 μs to 10 ms, 1% duty factor corresponds to repetition rate of 1 Hz-1 kHz. In order to provide such repetition rate, IGBT is the most suitable solid state switch at present time though other types of solid state switches such as IGCT or GTO may be used.

RF Inductive Plasma Generation at High Gas Pressure

RF inductive plasma system has advantages over other plasma generation system. One of them is the non-contact nature of plasma power coupling. In the RF inductive system, the plasma is generated by the RF power from the external antenna outside the plasma reactor wall. In comparison, DC and AC plasma generation requires power electrodes to be in contact with the plasmas. Without the exposed power electrodes, there is no plasma damage to the electrodes, thus providing better reliability and reducing materials contamination. The RF frequency for plasma power coupling in the disclosure is given between 50 kHz to 10 MHz. At a short pulse duration between 10 μs-200 μs, high RF frequency is important for reactivity control by pulse duration. At 1 MHz RF frequency, the control of pulse duration by a number of RF cycle is 1 μs increment. At 10 μs total pulse duration, this means that the pulsed plasma can control its reactivity within 10%, assuming linear increase in reactivity with pulse duration. If the frequency of RF power is decreased to 100 kHz, it is not possible to provide proper control of reactivity for the 10 μs pulse. It is thus desirable to operate the RF power period between 0.5% and 10% of total pulse duration. For longer pulse duration above 200 μs, the more relevant consideration is the efficiency of RF inductive power coupling between the antenna and the plasmas. For a fixed antenna inductance L, the maximum available instantaneous power on the antenna is given as $I*L*dI/dt$ or $6.28*L*I^2*f$, where I is the current flow in the antenna and f is the frequency of the RF power. Assuming an antenna inductance of 1 μH, in order to provide 500 kW of peak power, the required RF current is 280 A at 1 MHz RF frequency. If the RF frequency is decreased to 100 kHz for the same antenna, the required current to provide the same 500 kW is now 900 A. Higher currents in RF power system usually resulted in higher energy loss due to resistive power dissipation in cables, antenna and switches as well significant electromagnetic interference related to parasite inductances in the system. As such, it is desirable to keep the RF frequency at least above 50 kHz range in the case of high power RF pulsed switching system. This frequency range between 50 kHz to 10 MHz is well suited for the solid state switching power system using IGBTs, which can deliver very large RF pulse power from 10 kW to 10 MW for a short pulse duration of 10 μs-10 ms.

Plasma Breakdown

Figure 8:
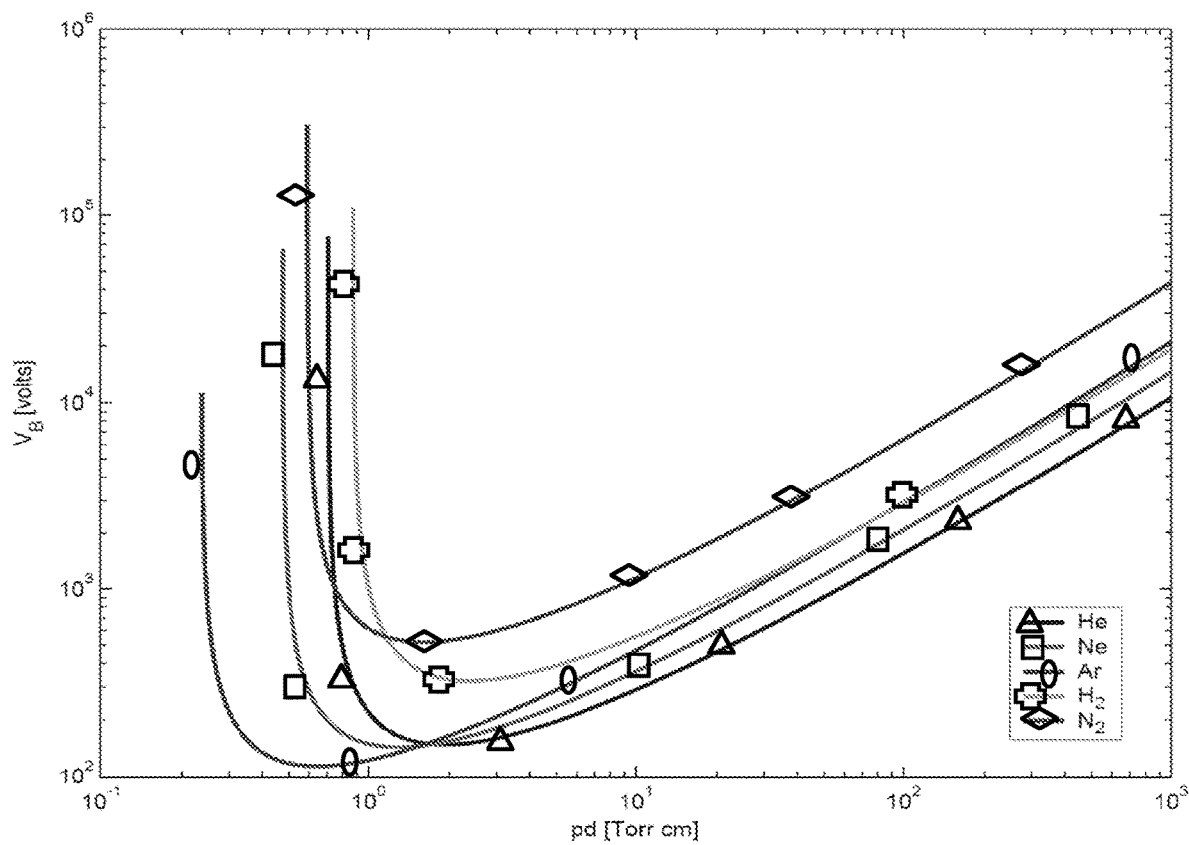
FIG. 8 shows Paschen curve data for the radio frequency pulsed inductive plasma reactor.

One of the technical challenges for pulsed RF plasma generation at high gas pressure is the difficulty of gas breakdown by RF power. In 1889, Paschen published a paper about the breakdown voltage with respect to gas pressure and the electrode spacing, which later became the basis of "Paschen's law" or "Paschen curve". As seen in FIG. 8, the Paschen curve for argon indicates the required breakdown voltage increases with the gas pressure for a given electrode spacing. Since the RF inductive plasma does not have physical electrodes, it is necessary to convert the relevant parameters. In the case of cylindrical RF antenna, the relevant y-axis scale would be the antenna voltage or azimuthal electric fields multiplied by the antenna circumference. Since the breakdown voltage in FIG. 8 is given by the electric field value multiplied with the electrode spacing between the parallel plate, it is necessary to multiply a factor of $2\pi$ or 6.28 to the published parallel plate breakdown voltage, in order to estimate the proper breakdown voltage needed for the for the cylindrical RF antenna configuration. As for the x-axis, one need to use the radius of the cylindrical antenna to estimate the "pd" value in the Paschen curve. So, in the case of a cylindrical antenna with a radius of 2.54 cm (or 1 inch), the pd value then becomes 12.7 torr cm at 5 torr argon pressure and the pd value becomes 127 torr cm at 50 torr argon pressure. For a parallel plate configuration, the required breakdown voltages are 600 Volt for 12.7 torr cm and 4,000 Volt for 127 torr cm. After the required conversion factor of $2\pi$ or 6.28 to properly account for the cylindrical geometry, it is clear that one needs very high antenna voltages to achieve breakdown, 3,600 V for 12.7 torr cm and 25 kV for 127 torr cm. Moreover, it is noted that the Paschen curve represent a minimum breakdown voltage, not the required voltage to breakdown the gas rapidly within 1-100 μs time scale. Typically, one needs a factor of 1.5 to 3 higher voltages to the antenna above the Paschen breakdown voltage within 1-100 μs time scale in order to ensure rapid and reliable breakdown.

Electrical Circuit to Provide High Voltages to the Antenna Using RF Pulse Power

Figure 11A:
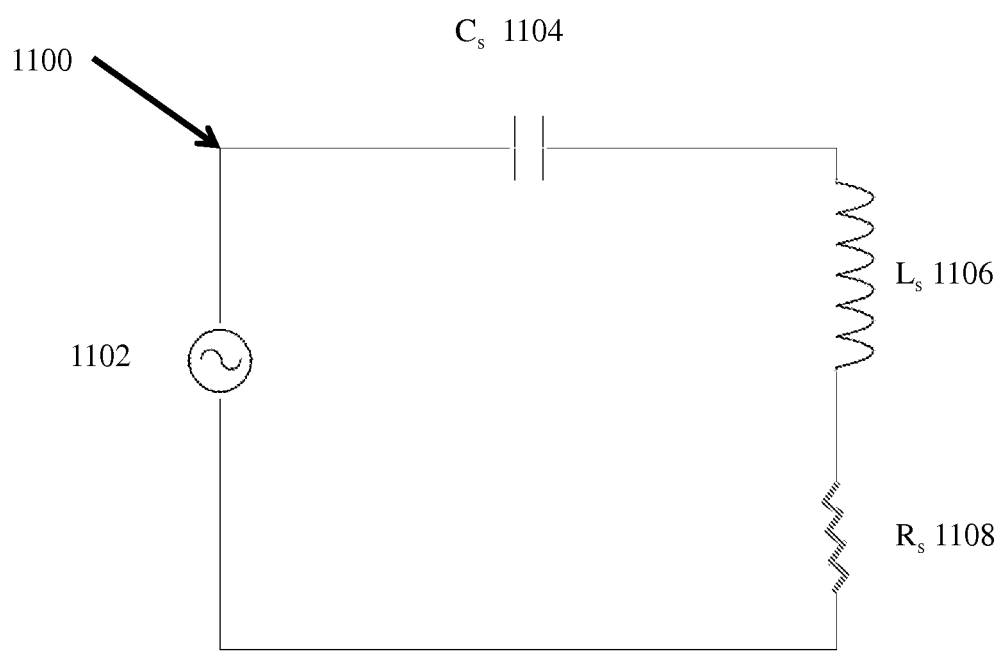
FIGS. 11A-11C show examples of a resonance circuit that may be used in the pulsed plasma reactor.
Figure 11B:
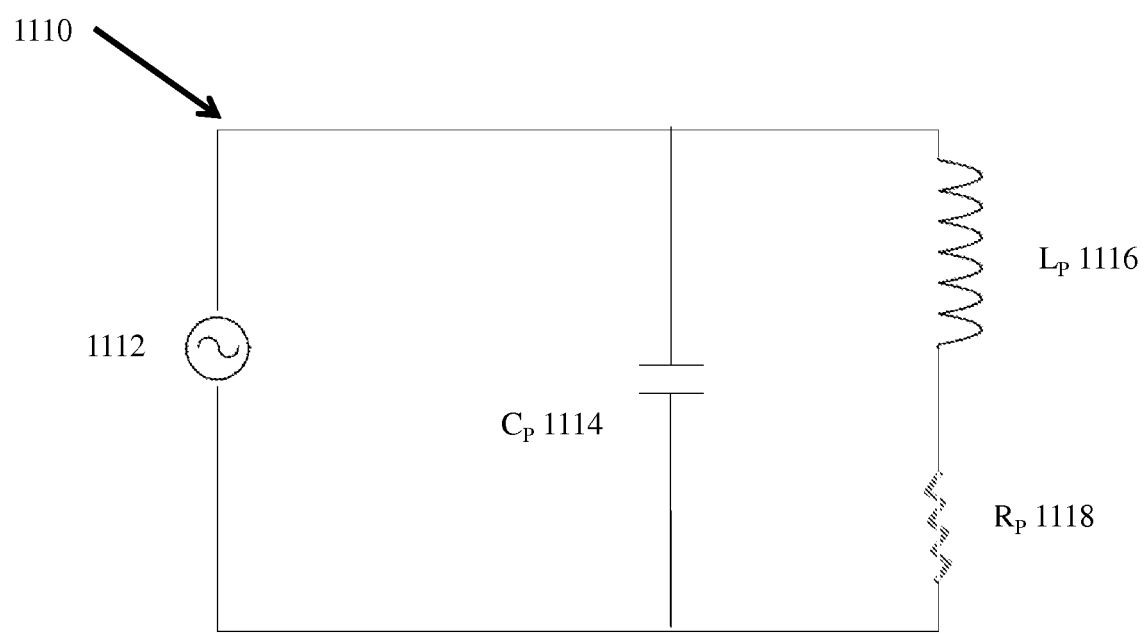
Figure 11C:
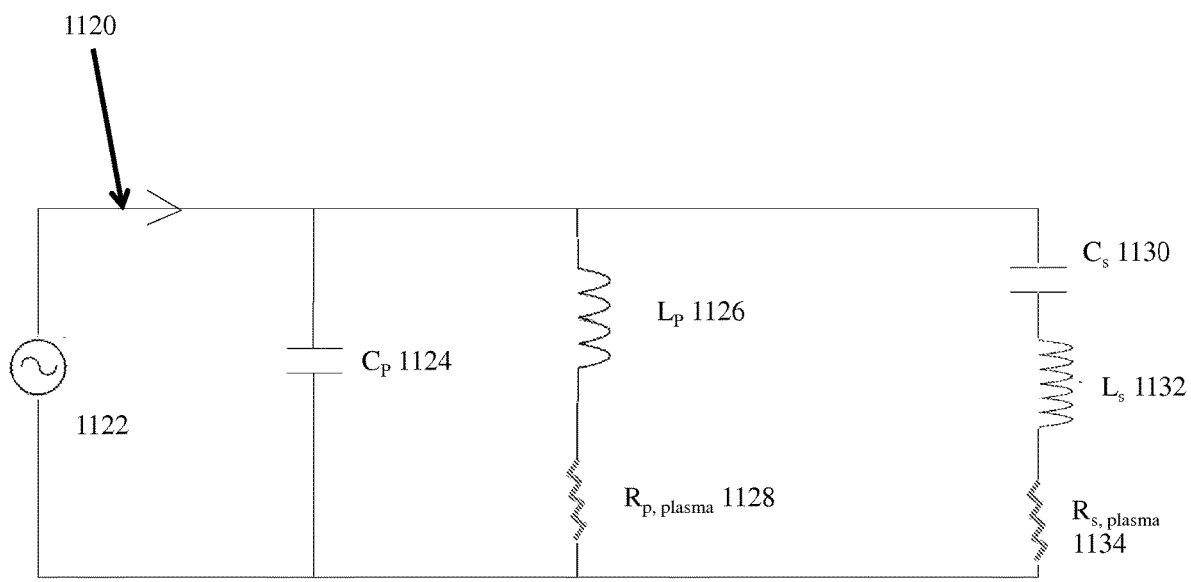

Gas breakdown at high pressures requires high voltage across the RF antenna. Based on the simple estimate from Paschen curve, the antenna voltage needs to be between 3.5 kV and 25 kV for the gas breakdown between 5 torr and 50 torr gas pressure for the reactor size of 2 inch diameter. The pulsed plasma reactor may use an RF electrical circuit using solid state switches and a cylindrical coil antenna configuration that can generate an antenna voltage of 20 kV at a RF frequency of 1 MHz. For a given antenna, the voltage across the antenna is given as $V_{antenna}=6.28f*L_{antenna}*I_{antenna}$, where $V_{antenna}$ is the voltage across the antenna, f is the RF frequency, $L_{antenna}$ is the antenna inductance, and $I_{antenna}$ is the antenna current. Since the antenna voltage increases with the antenna inductance for a fixed current, it is advantageous to utilize an antenna with sufficient inductance to provide the breakdown voltage. For example, an inductance is about 1.0 μH for a 6 turn cylindrical coil made of 6 mm copper tube with 50 mm diameter and with 10 mm pitch, corresponding to the coil length of 60 mm. This coil will encompass about 120 cm³ of reactor volume. In order to generate 20 kV across this antenna at 1 MHz of RF frequency, the antenna current needs to be 3.2 kA. For example, a series resonance circuit can be used, as shown in FIG. 11A, with the resonance capacitor to minimize the impedance in order to flow this much current. At 1 MHz resonance, resonance capacitor value is 25 nF, since $f_{resonance}=1/(6.28*L^{0.5}C^{0.5})$. Typically, the series resonance circuit has a finite resistance on the order of 0.1-0.2 ohm from the various electrical components such as wires, connectors and switches, prior to plasma loading. A quality factor, Q, of this circuit becomes 63 for a series resistor of 0.1 ohm, since $Q=6.28*f_{resonance}*L/R^{0}_{series}$, where $f_{resonance}$ is 1 MHz, L is 1 μH, and $R^{0}_{series}$ is 0.1 ohm. Therefore, this series resonance can be driven by the RF switching system with a RF voltage of 320 V and a RF current of 3.2 kA. This RF system can be readily built by existing commercial IGBT. Note that in this case, a circulating RF power is ~1 MW, assuming the voltage and the current values are in rms. For example, IXYS corporation offers a discrete IGBT with a voltage rating of 1200V rating, a current rating of 50-100 A and fast switching time of 43 ns, see part number IXYH50N120C3. By utilizing multiple IGBTs such as the above IGBTs from IXYS, it is then possible to construct RF pulse power system that can deliver 3.2 kA at 320V. Since the required RF pulse duration is short between 10 μs-10 ms, and thermal failure of IGBTs can be easily avoided by employing sufficient number of IGBTs, 32 or 64, with proper cooling. It is also possible to utilize a parallel resonance circuit (shown in FIG. 11B) to drive this antenna for the necessary voltage. However, in the case of parallel resonance circuit, one must provide the entire 20 kV from the RF switching system, while the current requirement will be much reduced. The optimal configuration would then be to utilise the series connection of IGBTs to provide sufficient voltage to the RF antenna, which is also a possible RF switching power system configuration. Though the choice of RF resonance circuits depends on many things, it is noted that a series resonance circuit is better suited because of the inherent robustness of parallel connection of IGBTs, compared to series connection of IGBTs. The overvoltage failure mode of solid state switch is much more challenging than overcurrent failure mode. Especially for short pulse operation described in the current invention, the IGBT system can handle larger than rated current, while the overvoltage failure is independent of the pulse duration. It is also noted that hybrid circuit combining the benefits of the series resonance circuit and the parallel resonance circuit can be used in combination as shown in FIG. 11C.

Plasma Sustainment and RF Power Delivery at High Gas Pressures

Figure 5:
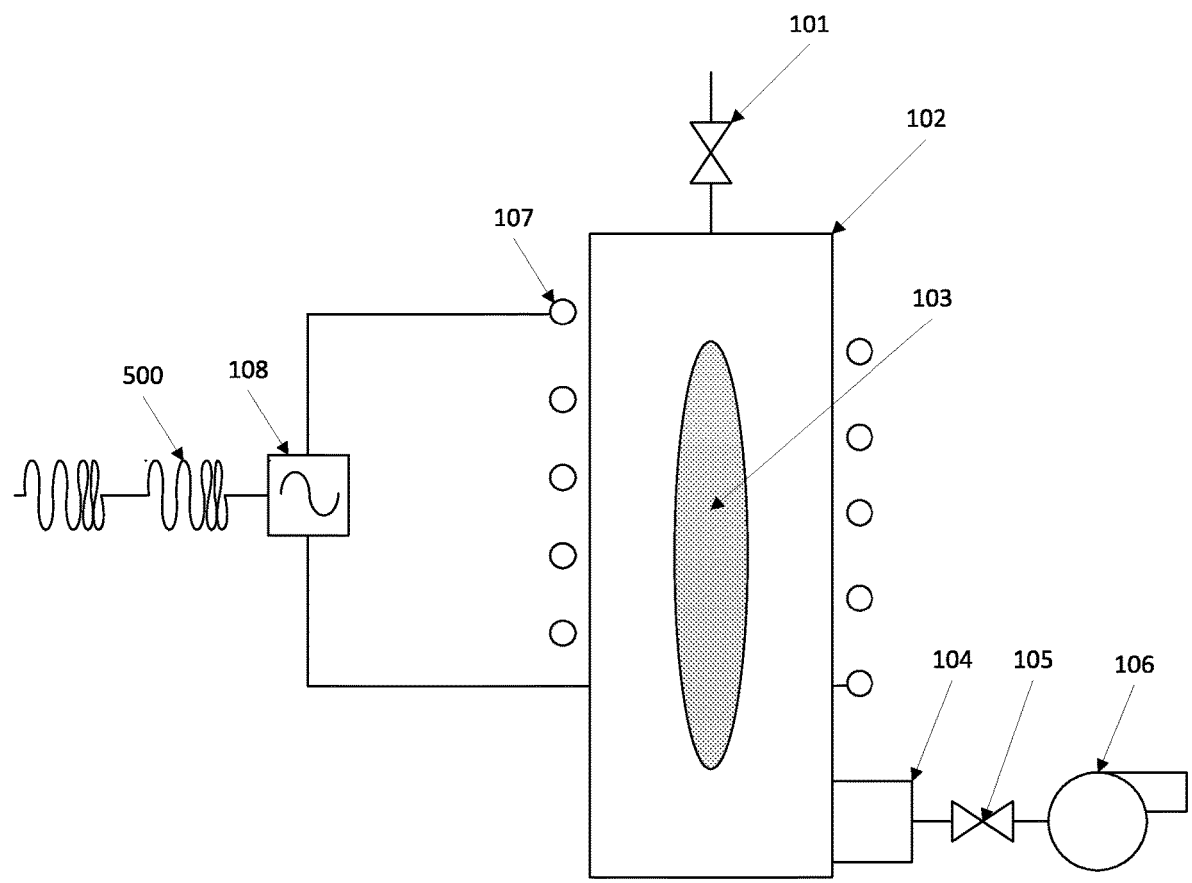
FIG. 5 illustrates another embodiment of the radio frequency pulsed inductive plasma reactor.
Figure 6A:
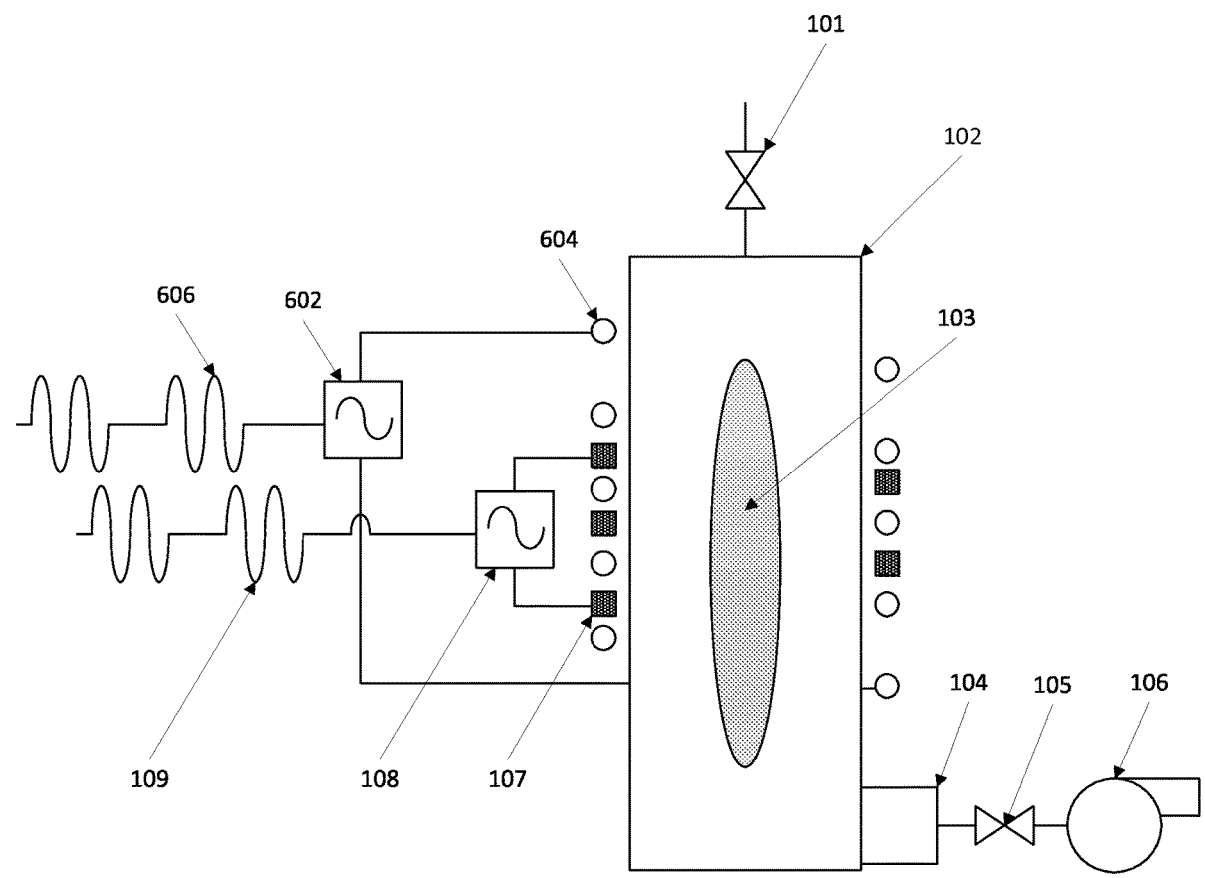
FIG. 6A illustrates another embodiment of the radio frequency pulsed inductive plasma reactor that has dual pulsed RF power systems.

After breakdown, the interaction between the plasmas and the RF antenna changes dramatically. This is because the gas medium is dielectric in nature with the appropriate dielectric constant of 1, while the plasma medium is electrical conductor with its conductivity comparable to copper. Since there is no appropriate plasma wave mode at high gas pressures, the RF power coupling to the plasma can be viewed as induction heating after breakdown. From the RF circuit point of view, this means there will be real resistance component in the RF circuit from the power coupling to the plasmas and decreased inductance of antenna from the induced current in the plasmas. There are three ways to handle this change in RF circuit composition. The first way is to do nothing and then the series or parallel resonance circuit will be out of resonance due to the reduced inductance of the antenna. If the change in the inductance is small compared its vacuum value, it is then still possible to maintain a large current in the series resonance circuit and to deliver high RF power to the plasmas. A second way is to change the switching frequency of the IGBTs to compensate the plasma coupling as shown in FIG. 5 and it is very useful to utilize the solid state switching RF powers since the RF frequency can be dynamically adjusted during the pulse by providing proper gate timing. In comparison, this method of change RF frequency during the pulse operation is very difficult in the case of vacuum tube based RF power system. In fact, in steady-state RF plasmas, typically a tuning circuit changes the capacitor value once the gas breakdown is achieved to compensate the change in antenna inductance. This second way, however, has some potential downside risk that needs to be considered. It is because the frequency shift of RF switching system is always upward since the resonance frequency is given as $f_{resonance}=1/(6.28*L^{0.5}C^{0.5})$, while the inductance is decreased. At higher frequency, RF power cannot penetrate the deep into the plasma reactor as well due to a phenomena called, "skin effect". If this skin effect is severe and RF coupling to the plasma is very localized, one can use the third approach. In the third approach, a separate set of RF antenna is deployed in the plasma reactor, preferably at the same axial location of $1^{st}$ the antenna, and this $2^{nd}$ antenna handles the plasma sustainment and the RF power delivery after the breakdown by the $1^{st}$ antenna. The location of the secondary antenna has to be overlapped (see FIG. 6A for example) or in close proximity to the primary power antenna, as shown in FIG. 6A. This is because the relatively fast cooling and extinction rate of plasma at high gas pressure. As for the RF circuit for the $2^{nd}$ antenna, it is more advantageous to utilize the parallel resonance circuit, as shown in FIG. 11B. This is because the $2^{nd}$ antenna does not need high voltage operation since its operation depends on the existence of plasmas in the reactor by the $1^{st}$ antenna. Here we provide description of a RF electrical circuit using solid state switches and cylindrical coil antenna configuration that can generate deliver 1 MW of RF power to 0.5 ohm plasma load. An inductance is about 0.2 μH for a 2 turn cylindrical coil made of 6 mm copper tube with 50 mm diameter and with 15 mm pitch, corresponding to the coil length of 30 mm. This coil will encompass about 60 cm³ of reactor volume. In this case, we will start with the resonance frequency of 0.4 MHz in order to improve the RF penetration into the reactor volume. At 0.4 MHz, the inductive impedance of the antenna is 0.5 ohm. Assuming the real part of antenna resistance is 0.5 ohm from the plasma loading, the total impedance of the antenna is 0.5 ohm. In order to couple 1 MW of RF power, the RF voltage needs to be 700 V and the RF current needs to be 1.4 kA. As previously mentioned, it is relatively straightforward to construct a RF switching power system using IGBTs for those parameters. In fact, this provides two possible configuration to power this $2^{nd}$ antenna. One is the use of $2^{nd}$ RF pulsed switching system to operate this $2^{nd}$ antenna in order to deliver 1 MW of RF power to the plasma load of 0.5 ohm, as shown in FIG. 6A. The other is to utilize a single RF pulse power system with two antenna in a hybrid resonance circuit, as in FIG. 6C and FIG. 11C. Initially the RF pulse power system operates at high frequency, for example at 1 MHz, and utilises the series resonance circuit for the $1^{st}$ antenna with high inductance to initiate the plasmas. After achieving breakdown, the RF pulse power system can then operate at lower frequency, for example at 0.4 MHz, and utilize the parallel resonance circuit for the $2^{nd}$ antenna with low inductance to deliver high power to sustain the plasma. Since the resonance conditions are different for the series resonance circuit and the parallel resonance circuit, only one part of the hybrid circuit is active at each frequency. Either configuration will be acceptable, though the choice of RF resonance circuits depends on many things such as cost, system complexities, controllability, efficiency and others.

Plasma Gas Heating

During the pulse, the plasma electrons can transfer its energy to gas molecules via collisions, resulting in gas heating. While the collision frequency is high, the rate of energy transfer efficiency is low for each collision due to very large discrepancy in mass. The general expression for gas heating by plasma electrons is given as $dT_{gas}/dt \sim n_e <\sigma v> T_e(m_e/m_{gas})$, where $T_{gas}$ the gas temperature, $n_e$ is the electron density in the plasma, $\sigma$ is the electron gas collision cross section, $v$ is the electron velocity, $T_e$ is the electron temperature and $m_e/m_{gas}$ is the mass ratio between electron and gas atoms. In the case of argon operating at 10 torr, the plasma electron density is $1.4 \times 10^{16}$ cm$^{-3}$, assuming a 5% ionization fraction. The plasma density can be controlled by the RF pulse input power, while the average electron temperature is between 5 and 10 eV in a wide range of input powers, based on the experimental and theoretical database of rf thermal plasmas in steady state. It is noted that the plasmas establish its density and temperature equilibrium for a given rf input power in a very short time, typically within a few μs due to the rapid response of electrons to the applied rf electric fields. We will use 5 eV electron in this example, resulting in electron thermal velocity of $9.4 \times 10^7$ cm/s and electron temperature of 57,000 Kelvin. At 5 eV, electron-gas collision cross section is approximately $1 \times 10^{-15}$ cm$^2$ for argon gas. By putting the above numbers in the gas heating expression, $dT_{gas}/dt$ is $1 \times 10^8$ Kelvin/s or 100 Kelvin/μs. This result shows that the gas temperature in the pulsed plasma reactor will gradually increase over the pulse duration by electron gas heating. For a fixed plasma density of $1.4 \times 10^{16}$ cm$^{-3}$, the gas temperature will rise to 500 C (from 20 C inlet temperature) for 5 μs pulse duration and to 1,000 C for 10 μs pulse duration, in this simplified estimate. Thus, the pulse duration control provides a powerful yet convenient method to adjust the reactor gas temperature, especially for pulse duration between 10 μs and 10 ms. Since the gas temperature is one of the critical parameters to determine the thermal and chemical reaction of the precursors, this results provide the basis for the reactivity control of the pulse plasmas. It is noted that we have ignored the energy loss mechanism by gas via conduction, convection and radiation, so the temperature rise will be less than this value and the gas temperature will likely saturate between 5,000 C and 10,000 C. It is also noted that the gas heating rate can be controlled by plasma density or RF pulse power. Finally, we note that in the case of liquid and solid precursor materials, the heating rate of those non-gaseous medium will be less than the one of the gas precursor materials since the only surface layer of the liquid and solid materials can absorb the energy directly from the plasmas.

Pulsed Plasma Operation Heat Generation

The pulse plasma reactor only generates a small amount heat during the pulse operation. It is noted that the heat capacity of the gas is very small, 12.6 J/(mole×Kelvin). Since the pulse plasmas heat only a small amount of gas molecules, $2.3 \times 10^{-5}$ mole of argon gas for 100 cm$^3$ reactor volume at 5 torr, the total amount of heat from the high temperature is gas is relatively small. Even at 5,000 C, the argon gas in the pulsed reactor will only contain 1.5 J of energy at the above condition. Even at very high repetition rate of 1 kHz, the total gas heating results in 1.5 kW, equivalent to a household hair dryer. This is because of the short pulse nature of pulsed RF plasma operation. By limiting heat generation during the pulse, it is then possible to utilize many thermally sensitive materials as substrate, filter and reactor wall materials in the RF pulsed plasmas. Example will be plastics, polymers, fiberglass, fabric, ceramics, glass, and even papers. If a flexible materials can be utilised, roll-to-roll plasma surface treatment can greatly increase the materials throughput compared to batch system.

A repetitively pulsed RF plasma source present a major paradigm change in how the plasma reactor operates with respect to carrier gas and precursor materials injection, gas pumping and reactor operating pressures. A similar example is the internal combustion engine with the timed ignition, fuel injection, compression and exhaust. Since the plasma activation of precursor materials occurs only during the RF power pulse or during the afterglow phase immediately after the RF power pulse, it can be beneficial to operate the plasma reactor with timed carrier gas and precursor materials injection. Separately, the gas pumping may be operated in a pulsed mode in synchronization of pulsed RF power or pulsed gas and precursor injection. Even the reactor pressure can be controlled and modulated in time domain with respect to other pulses in the systems such as RF power, injection and pumping. The disclosure introduces the concept of timed pulsed operation among RF pulse power, gas and precursor materials injection, pumping and dynamic reactor pressure control.

The benefits from the pulsed operation of RF power, injection, and pumping reactor pressure are: reduction of materials and electricity usage, increase in reaction throughputs. In addition, the timing control among different pulses represents a powerful control tool for plasma reactivity. For example, the timing control in connection with the RF power level and the pulse duration can selectively increase one or multiple chemical reaction paths compared to other reaction paths. The reaction selectivity allows the RF pulsed plasma reactor to better control reaction stoichiometry in material synthesis and film deposition and to provide a mechanism of crystal phase control in polymorphic materials synthesis. In addition, the pulsed flow of activated reactive materials onto the target substrate can fundamentally alter the interaction between the reactive radicals from the plasmas and the substrate surface layer. In the case of surface deposition, the reactive materials flow onto the target substrate and adsorb on the surface area. Since the reactive materials flow stops after the pulse operation, the affected surface layer can undergo relaxation prior to the next wave of reactive materials flow. By controlling the time lapse between the repetitively pulsed reactive materials flow, it is possible to control the property of the surface deposition. Similar mechanism can work for surface layer removal and surface treatment process.

Figure 3A:
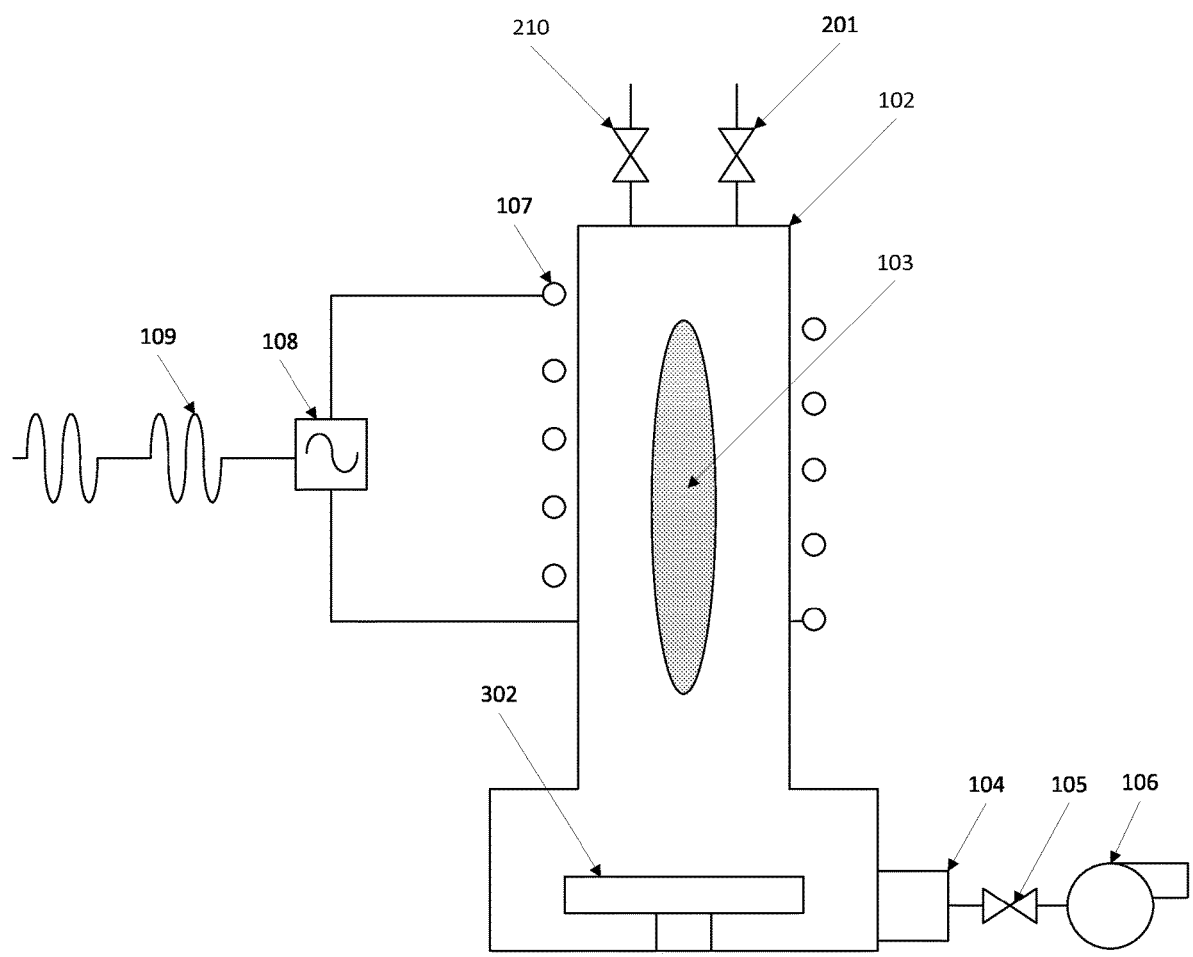
FIG. 3A illustrates an embodiment of the radio frequency pulsed inductive plasma reactor with a substrate.
Figure 3B:
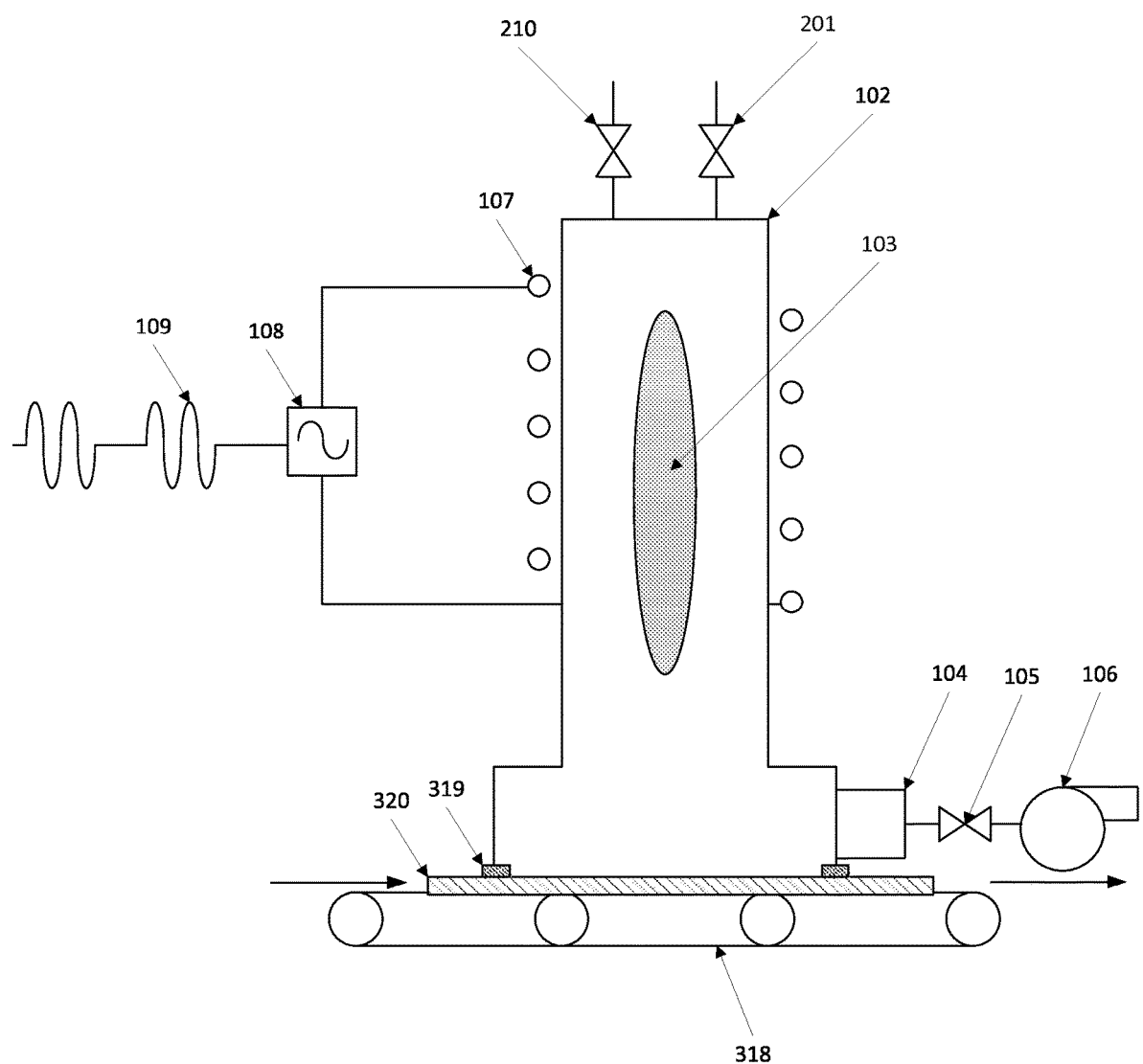
FIG. 3B illustrates an embodiment of the radio frequency pulsed inductive plasma reactor with a substrate and a lock load system.

FIG. 2 illustrates another embodiment of the radio frequency pulsed inductive plasma reactor. In this reactor, the inlet area may have two inlets 201, 210 wherein one inlet is for a carrier gas and the other inlet is for the precursor materials. The rest of the reactor is the same and has the same reference numbers (which are therefore not described in detail here) as the reactor in FIG. 1 that generates a plasma 103. FIG. 3A illustrates an embodiment of the radio frequency pulsed inductive plasma reactor with a substrate 302 that is inside the reactor chamber for deposition, coating, surface modification and treatment, surface removal and/or nano-device fabrication on the substrate. The rest of the reactor is the same and has the same reference numbers (which are therefore not described in detail here) as the reactor in FIG. 1 that generates a plasma 103. FIG. 3B illustrates an embodiment of the radio frequency pulsed inductive plasma reactor with a moveable substrate 320 and a lock load system 318 for deposition, coating, surface modification and treatment, surface removal and/or nano-device fabrication on the substrate. The rest of the reactor is the same and has the same reference numbers (which are therefore not described in detail here) as the reactor in FIG. 1 that generates a plasma 103. The load lock system transports the substrate in and out of the reactor chamber and may have a set of vacuum locks 319. This embodiment may be used to move large sized substrates into/out of the reactor chamber.

Figure 4:
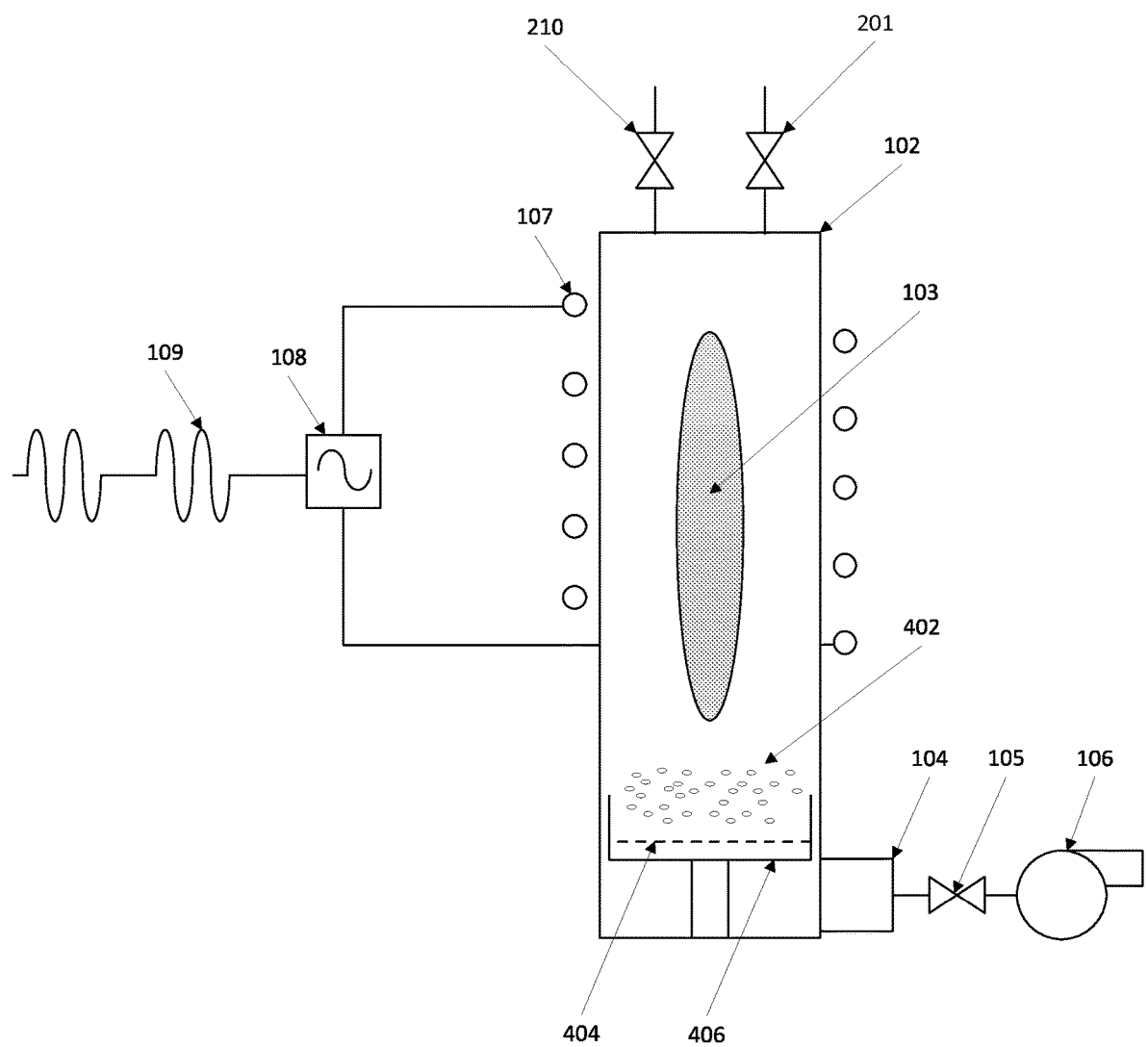
FIG. 4 illustrates another embodiment of the radio frequency pulsed inductive plasma reactor having a material collection system.

FIG. 4 illustrates another embodiment of the radio frequency pulsed inductive plasma reactor having a material collection system for collecting nano materials 402 produced inside of the reactor from the precursors. The material collection system collects different materials generated during the plasma generator and sustainment process. The material collection system may be one or more filters 404 and/or one or more collectors 406. The material collection system may capture nanoparticles, nanofibers, nanowires, nanocrystals such as quantum dots and nanophosphors synthesized from the reactor. The rest of the reactor is the same and has the same reference numbers (which are therefore not described in detail here) as the reactor in FIG. 1 that generates a plasma 103.

FIG. 5 illustrates another embodiment of the radio frequency pulsed inductive plasma reactor with dynamic RF frequency tuning 500 to improve RF coupling after breakdown and plasma generation. The rest of the reactor is the same and has the same reference numbers (which are therefore not described in detail here) as the reactor in FIG. 1 that generates a plasma 103. After the breakdown, the loading of the antenna by the plasma will change the value of the antenna inductance, which will cause the resonance frequency to shift to a different value compared to the pre-breakdown. In steady-state rf plasmas, a tuning network typically adjusts the capacitor value in order to compensate the change in resonance frequency, which takes more than 10 ms response time due to its mechanical nature of the adjustment. As a result, the traditional approach to adjust the resonance frequency is not suitable for the pulsed rf plasma generation. Instead, this invention utilises the change in rf frequency of the power system, triggered by the onset of plasma formation. One of the benefits of using solid state switching rf system is its ability to change the rf frequency by simply changing the switching pulse timing. In the case of upward resonance frequency shift, the control system timing can be pre-programmed to increase the switching frequency after the breakdown to compensate the change in the antenna inductance by the plasma after breakdown.

Figure 6C:
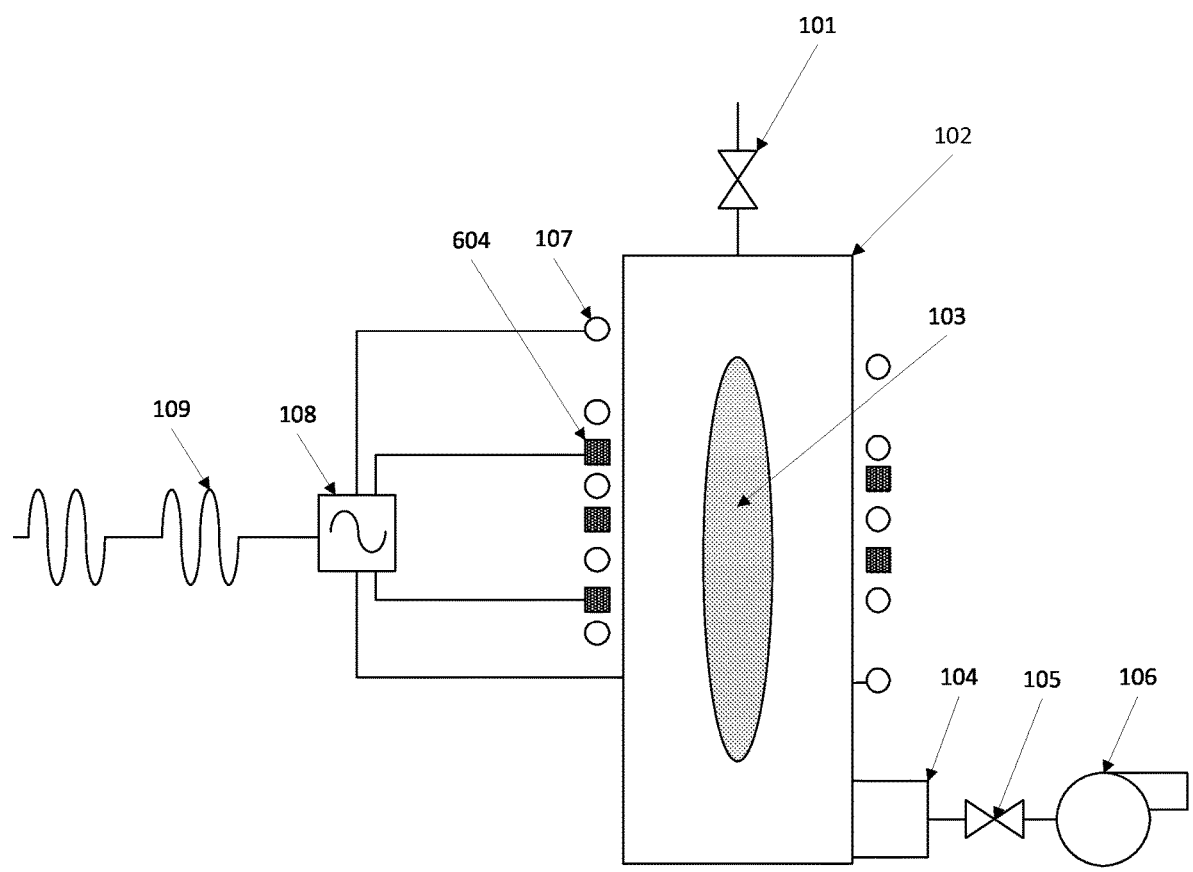
FIG. 6C illustrates another embodiment of the radio frequency pulsed inductive plasma reactor that has antennas and a single pulsed RF power system.
Figure 7A:
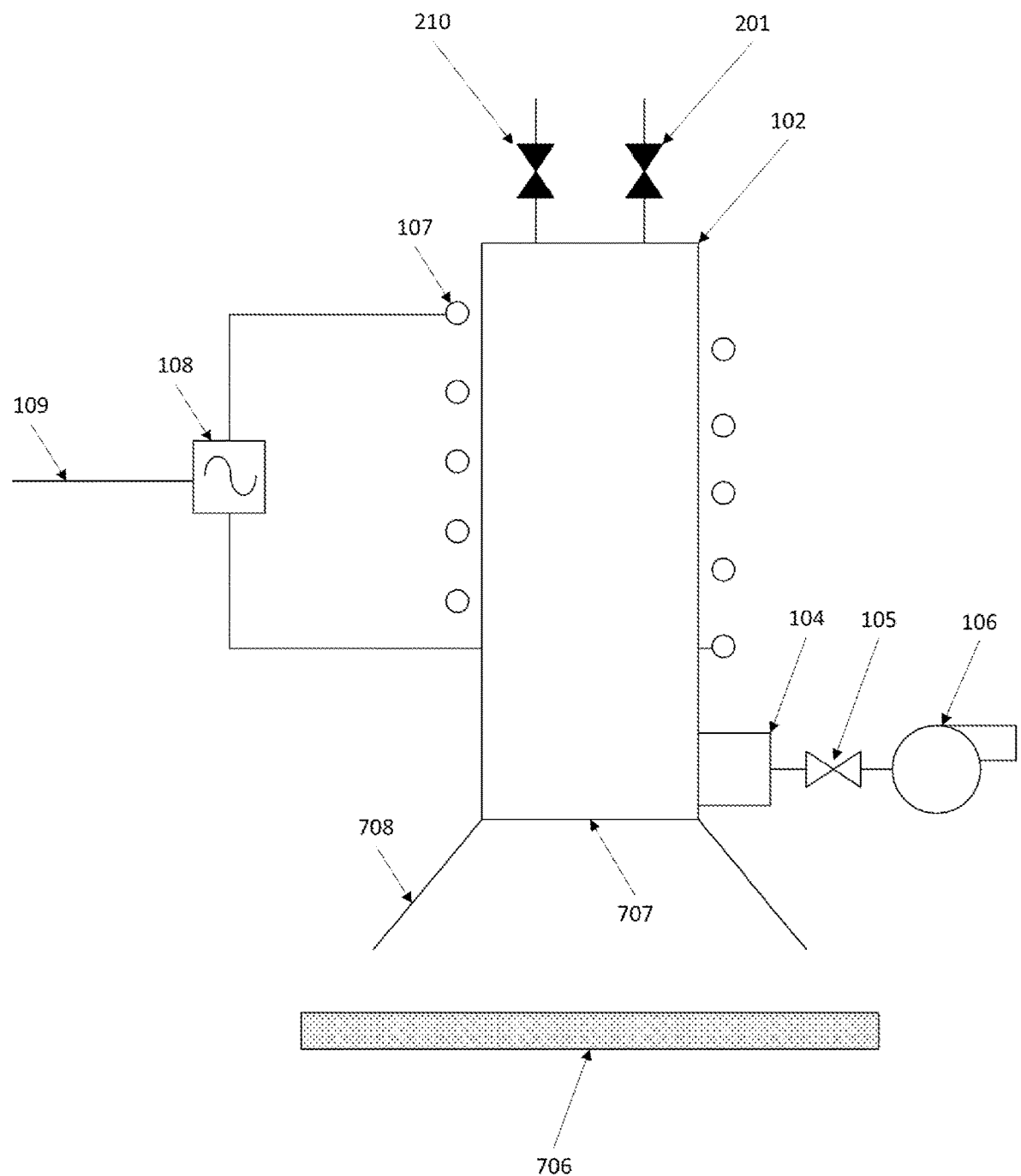
FIGS. 7A-7E illustrate another embodiment of the radio frequency pulsed inductive plasma reactor, termed as "pulsed plasma spray device", that transports the activated materials from the plasma reactor to the target surfaces located outside the reactor.
Figure 7B:
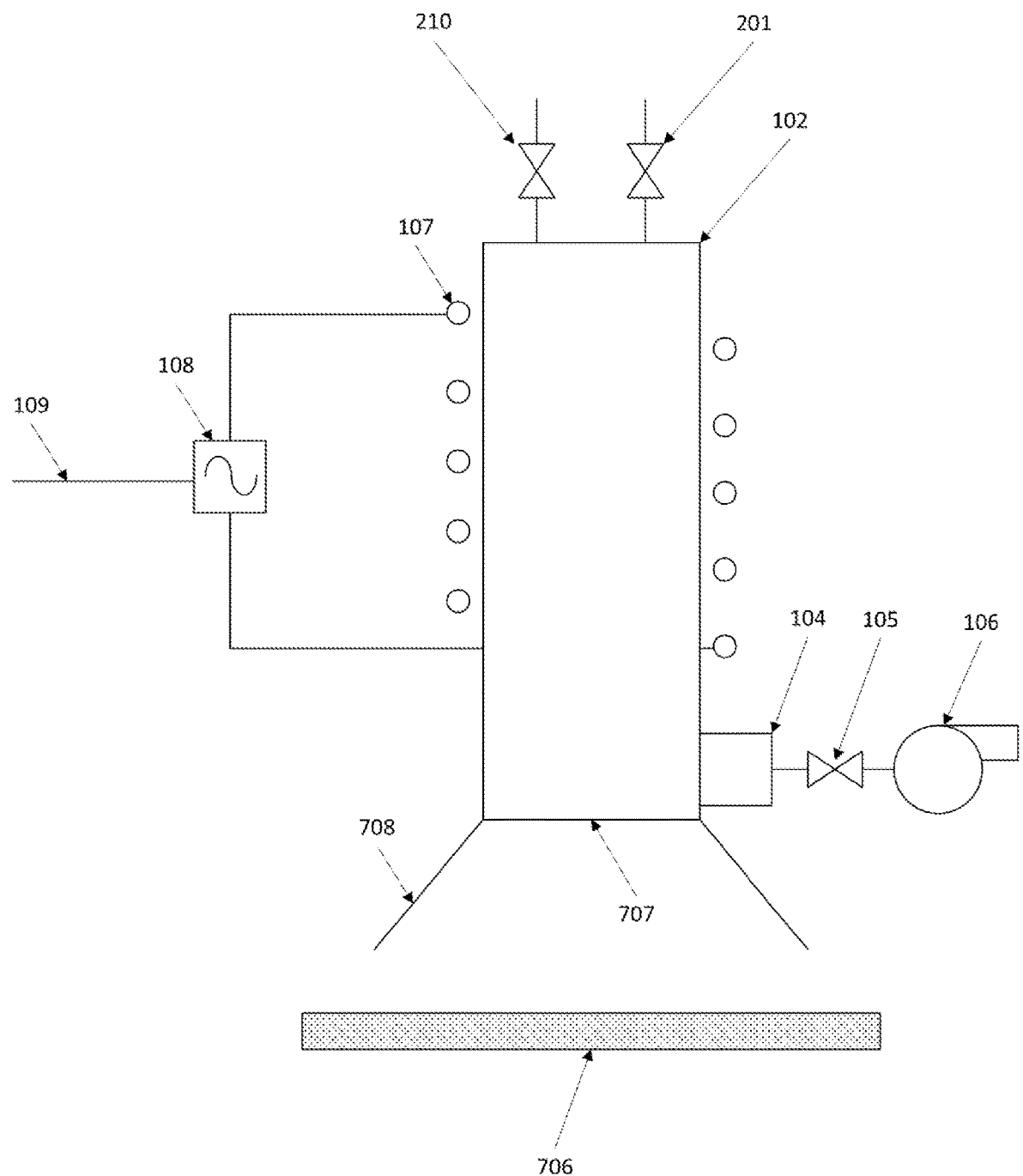
Figure 7C:
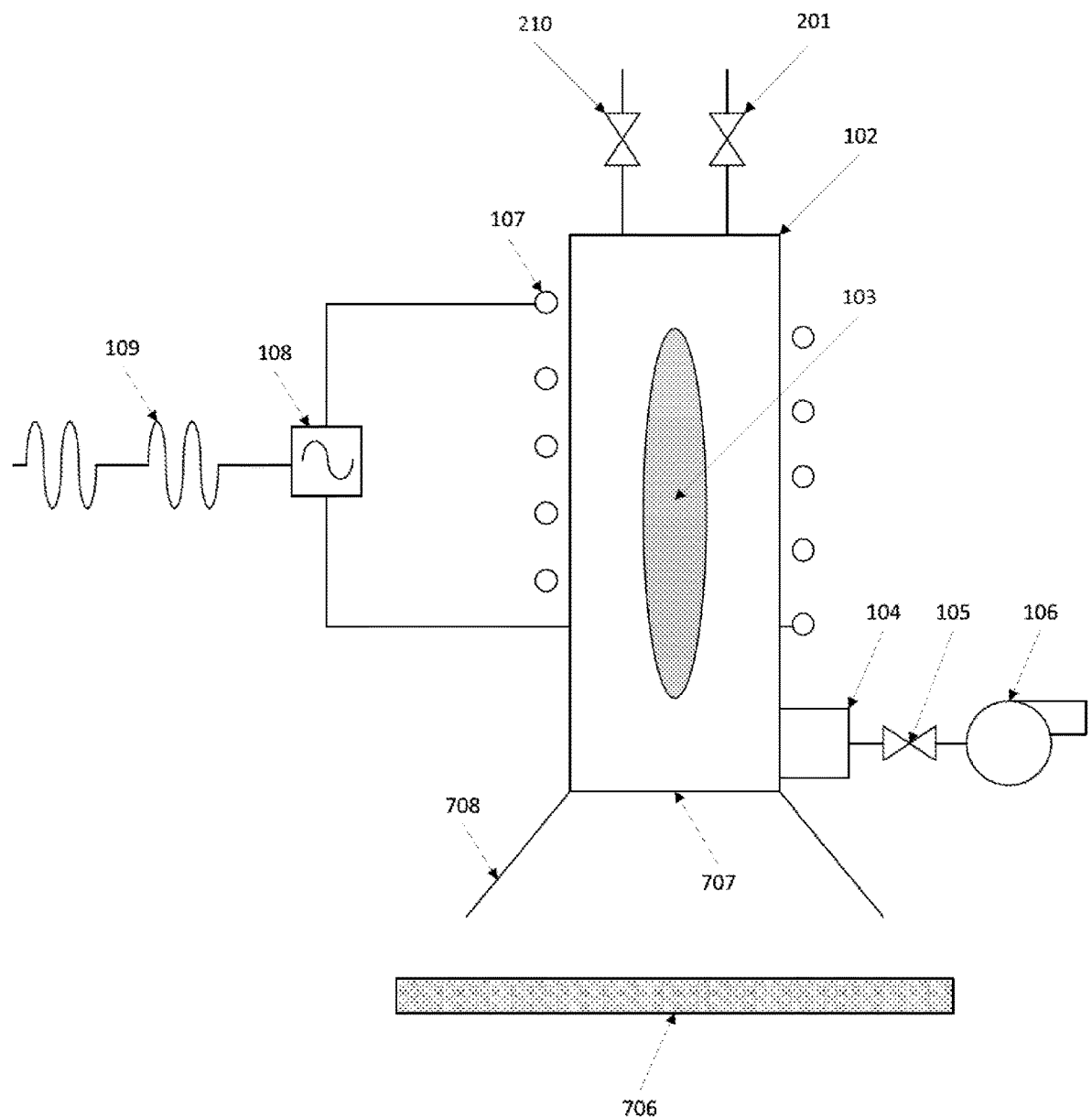
Figure 7D:
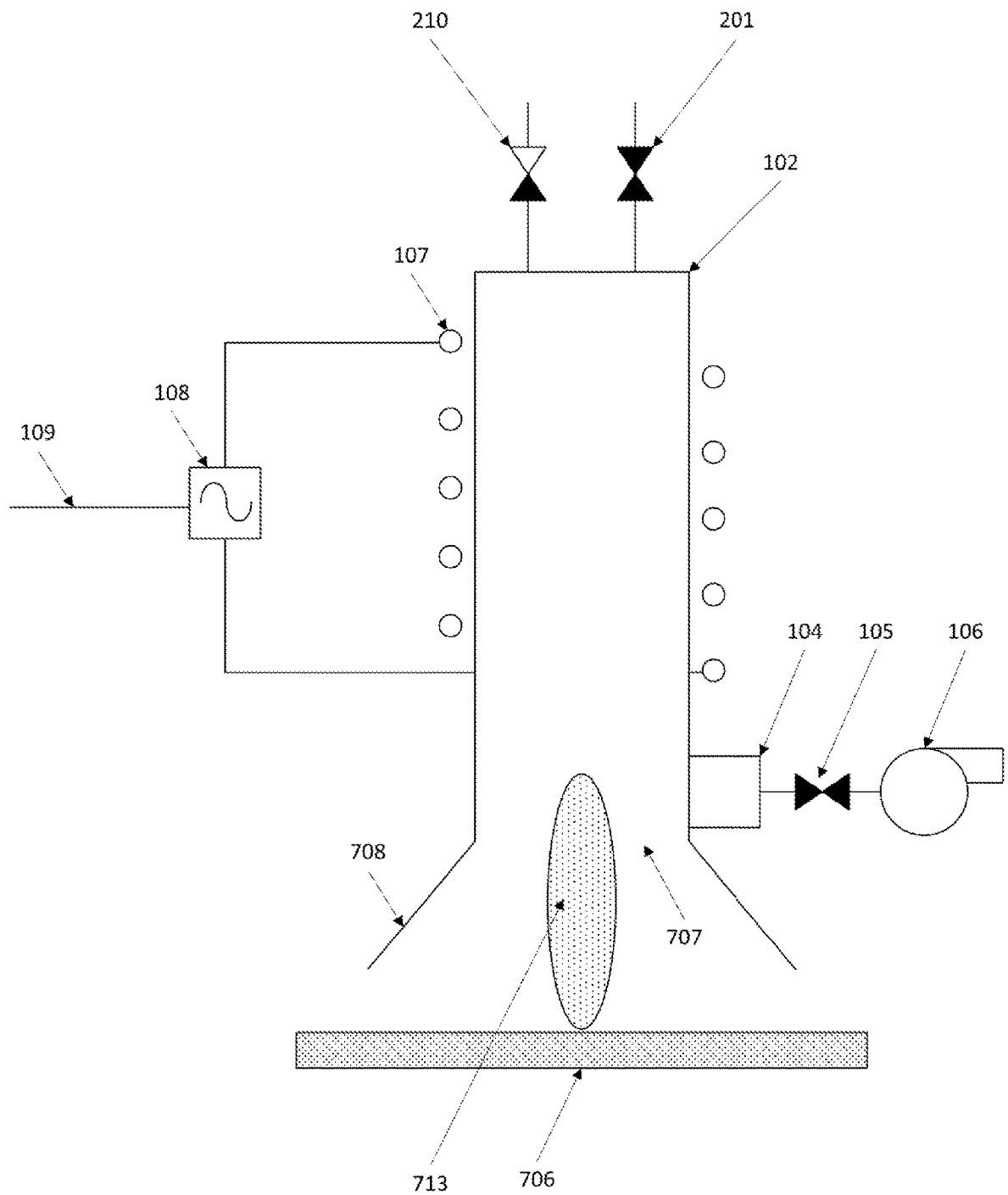
Figure 7E:
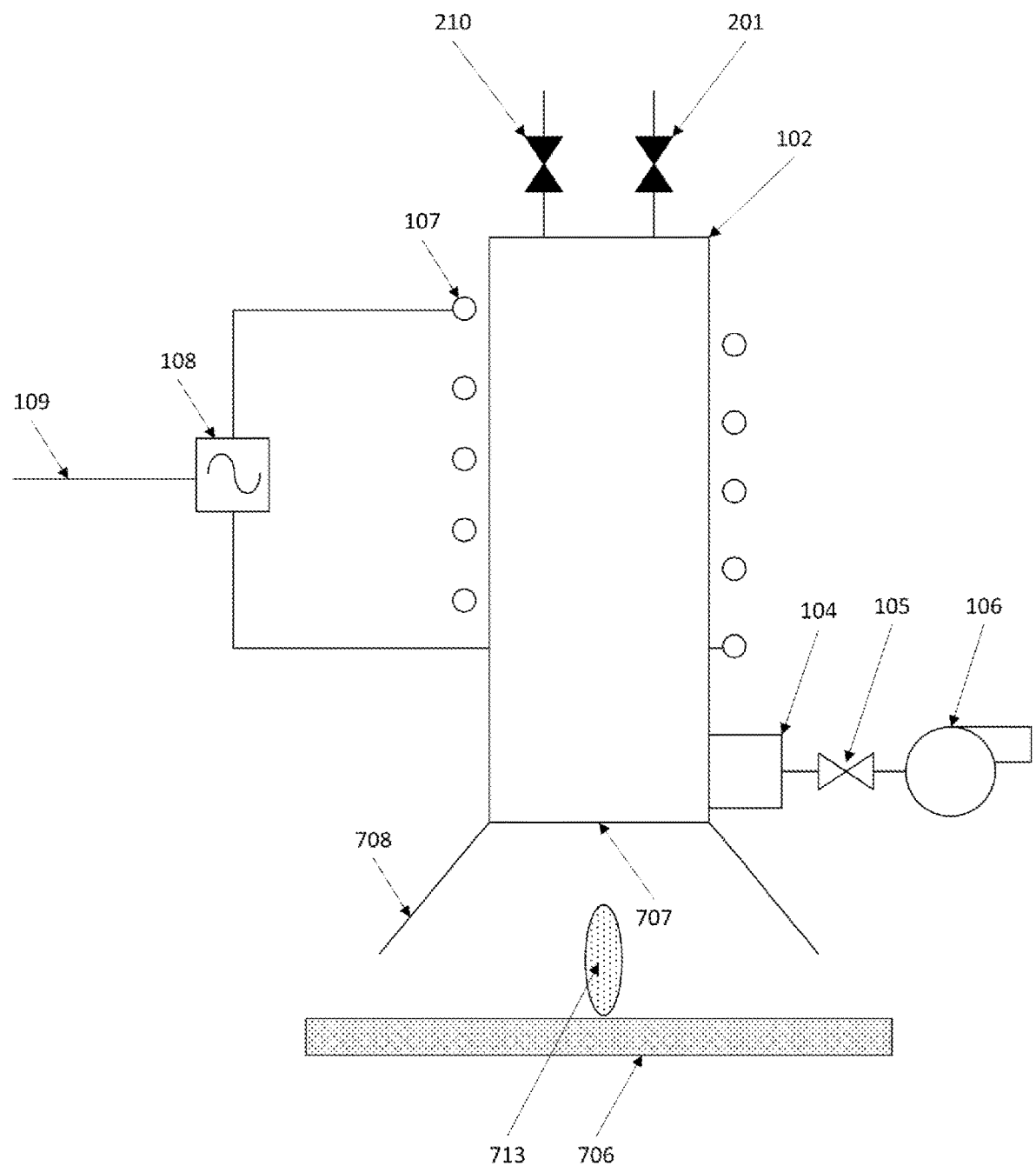

FIGS. 6A-6C illustrate other embodiments of the radio frequency pulsed inductive plasma reactor that has dual pulsed RF power systems 108, 602. The rest of the reactor is the same and has the same reference numbers (which are therefore not described in detail here) as the reactor in FIG. 1 that generates a plasma 103. The first RF power system may include elements 107-109 and the second may include elements 602, 604 and 606 (pulsed signal, RF source and antenna). FIG. 6C illustrates another embodiment in which the two antennas 107, 604 may be both driven by a common RF source 108 that generates the pulsed RF signal 109. The rest of the reactor in FIG. 6C is the same and has the same reference numbers (which are therefore not described in detail here) as the reactor in FIG. 1 that generates a plasma 103. In some implementations, the antennas for each pulsed RF power source are interposed as shown in FIG. 6A, but may also be configured differently. In this embodiment, a first pulsed RF power source may be used to initiate the plasma generation and then the second pulsed RF power source may be used to sustain the plasma once it is generated.

FIGS. 7A-7E illustrate process for generating pulse plasma using the pulsed plasma reactor. A pulsed plasma spray source is another example of pulse plasma source and timed operation of gas injection and pumping. In conventional plasma spray, the plasma source needs to operate at atmospheric pressure or above atmospheric pressure in order to transport plasma activated reactive species onto the target surface located in the ambient environment. For example, a thermal plasma spray is one example of such device that thermally activates precursor materials in the plasma reaction volume and the activated materials such as melted metals and ceramics are sprayed onto a target surface located outside the reactor in an ambient pressure. In a pulsed plasma spray source, RF pulsed plasma operation can occur at gas pressures below atmospheric pressure, while thermally and chemically activated materials can be sprayed onto a target surface located in an ambient pressure.

Step 1 (FIG. 7A): At $t_0$, the plasma reactor volume is sealed by a seal 707 that is closed from the ambient environment and the gas pumping is provided to maintain low gas pressure in the reactor volume. No RF power is being applied in this step. During this process, the inlet valve 201, 210 may be closed (filled pattern) and the pumping valve 105 may be open (unfilled pattern.)

Step 2 (FIG. 7B): Between $t_1$ and $t_2$, carrier gas and precursor materials are introduced into the plasma reactor with operation of pulsed inlet valves 201, 210. The gas pressure in the reactor is maintained between 5 torr and 500 torr by the balance between the gas inflow and the pumping, while being sealed by the seal 707 from the ambient pressure. However, the pumping valve 105 may be open.

Step 3 (FIG. 7C): Between $t_2$ and $t_3$, pulsed RF powers are applied and generate plasmas 103. The plasma can activate precursor materials and generate reactive species. It is noted that rapid plasma heating will increase the pressure in the reactor volume from its initial pressure and the seal 707 is still closed and thus no materials are coming out of an exit nozzle 708. In this process, the inlet valve 201, 210 may be open and the pumping valve 105 may be open.

Step 4 (FIG. 7D): Between $t_3$ and $t_4$, the activated materials by the pulsed plasmas leave the reactor and flow toward the outlet. With the use of rotating pneumatic seals 707, an exit nozzle 708 is open, which allow the activated materials 713 to flow onto a target surface 706 located outside the reactor at ambient pressure. At the same time, the gas pumping path is closed. If the reactor gas pressure during the pulsed plasma operation exceeds the atmospheric pressure, the outflow of the reactive materials can be directed toward the target surface without additional gas injection. If the reactor gas pressure during the pulsed plasma operation is below the atmospheric pressure, an additional gas valve in the reactor upstream is open in order to increase the reactor gas pressure and to generate outward flow to the ambient environment through the exit nozzle.

Step 5 (FIG. 7E): Between $t_4$ and $t_5$, once the majority of reactive materials are sprayed onto a target surface, the seal 707 is then closed, while the gas pumping is resumed. Once the gas pressure in the reactor drops below desired set point after sufficient gas pumping, the cycle repeats from step 1 to step 5 with the repetition rate between 1 Hz and 100 Hz.

The above described pulsed plasma spray allows the various in-situ plasma treatments such as deposition, surface modification, surface layer removal and patterning, for large objects and the target materials that cannot be contained in the plasma reactor. Furthermore, since the pulsed plasma generates little thermal heat, the pulsed plasma spray can be applied to any heat sensitive materials such as glass, plastics, polymers, fabric, paper, fiberglass, and composite materials. For example, the pulsed plasma spray can apply protective coatings on the heat sensitive large scale glass reinforced plastic structure materials such as wind turbine blades and marine vessel body.

Experimental and Theoretical Results

Experimental data for RF pulsed plasma generation between 0.8-1.5 MHz, 1 torr to 10 torr argon and helium was performed. The pulse duration during the experiments of 10-100 µs range has been demonstrated. Repetitive power system is also demonstrated.

FIG. 8 shows Paschen curve data for the radio frequency pulsed inductive plasma reactor for common carrier gases such as helium (He), neon (Ne), argon (Ar), hydrogen ($H_2$) and nitrogen ($N_2$), indicating that high voltage at the antenna (shown along the vertical axis) is needed to achieve rapid gas breakdown at high gas pressures.

Figure 9:
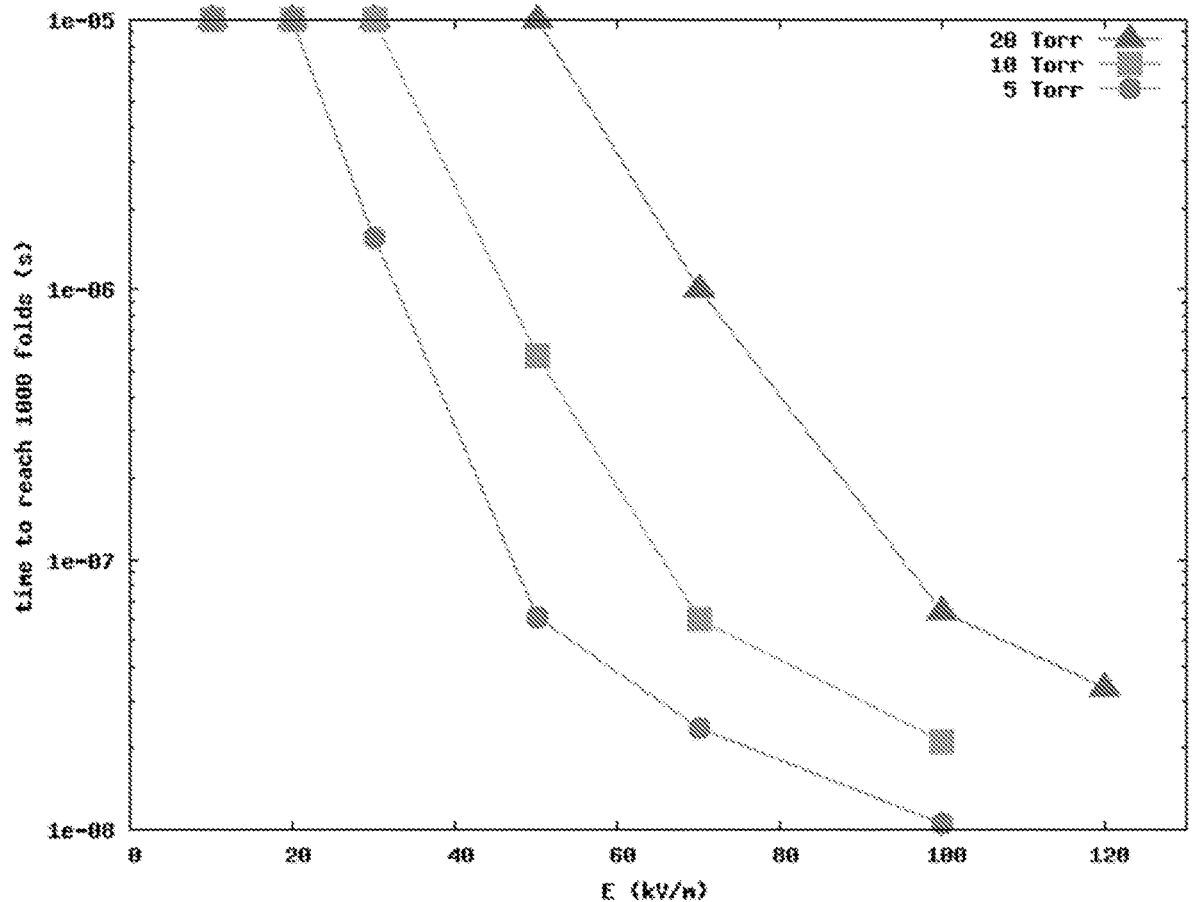
FIG. 9 shows particle in cell simulation results with breakdown delay time as a function of azimuthal electrical strength of the antenna for gas pressure in argon using 1 MHz RF power.
Figure 10A:
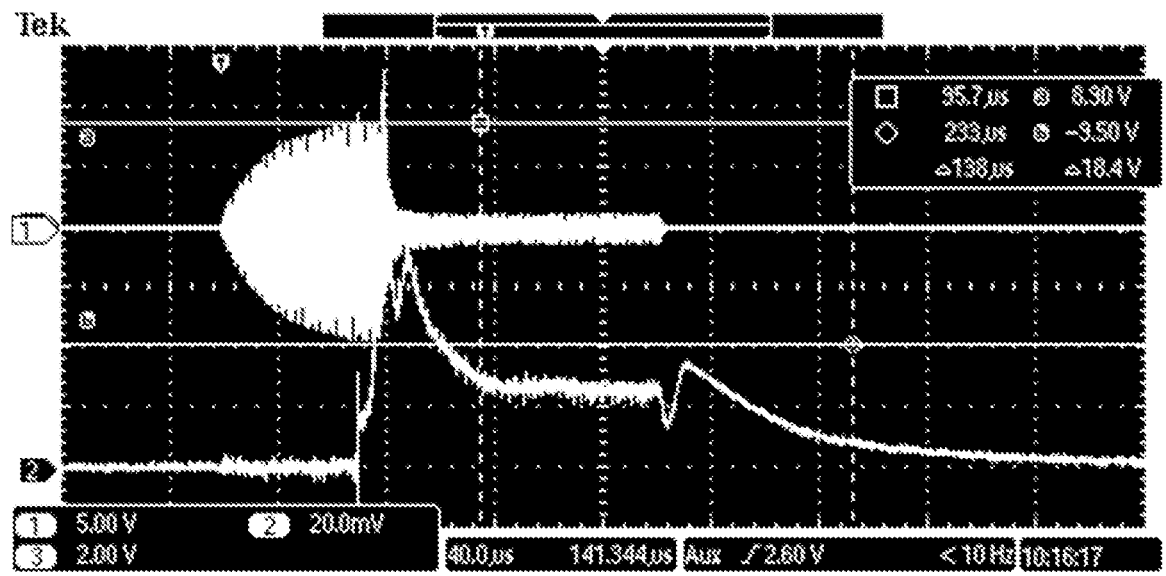
FIG. 10A-10D show experimental results for the pulse plasma reactor.
Figure 10B:
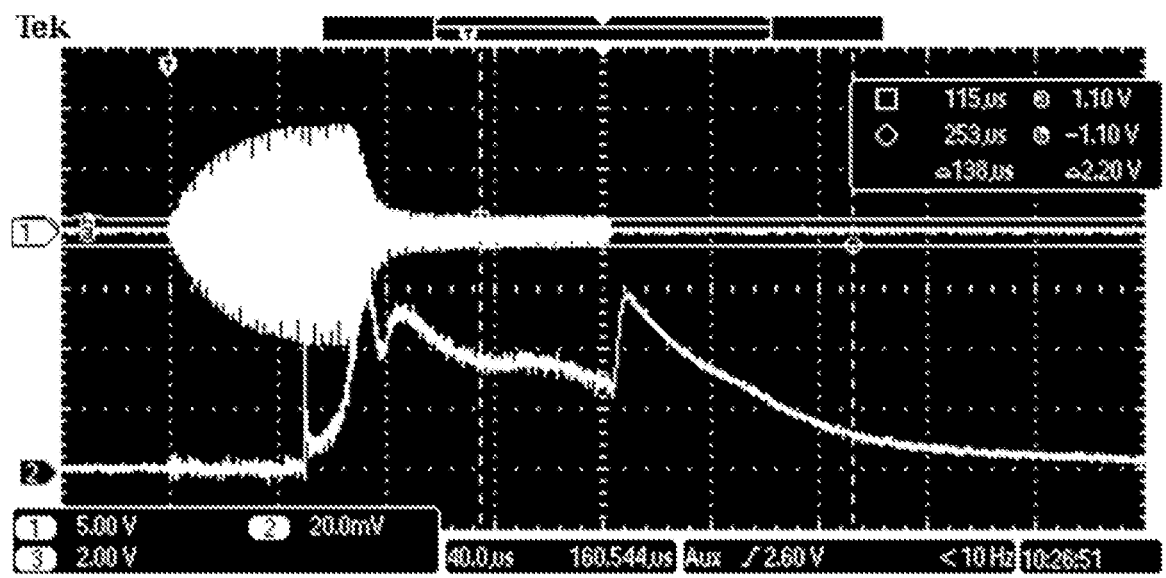
Figure 10C:
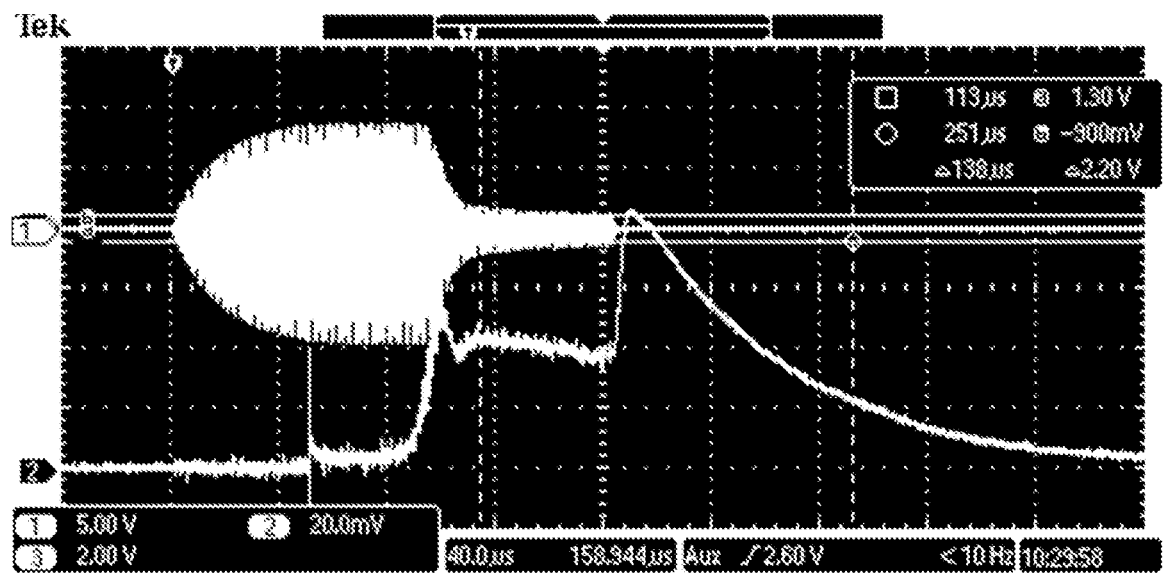
Figure 10D:
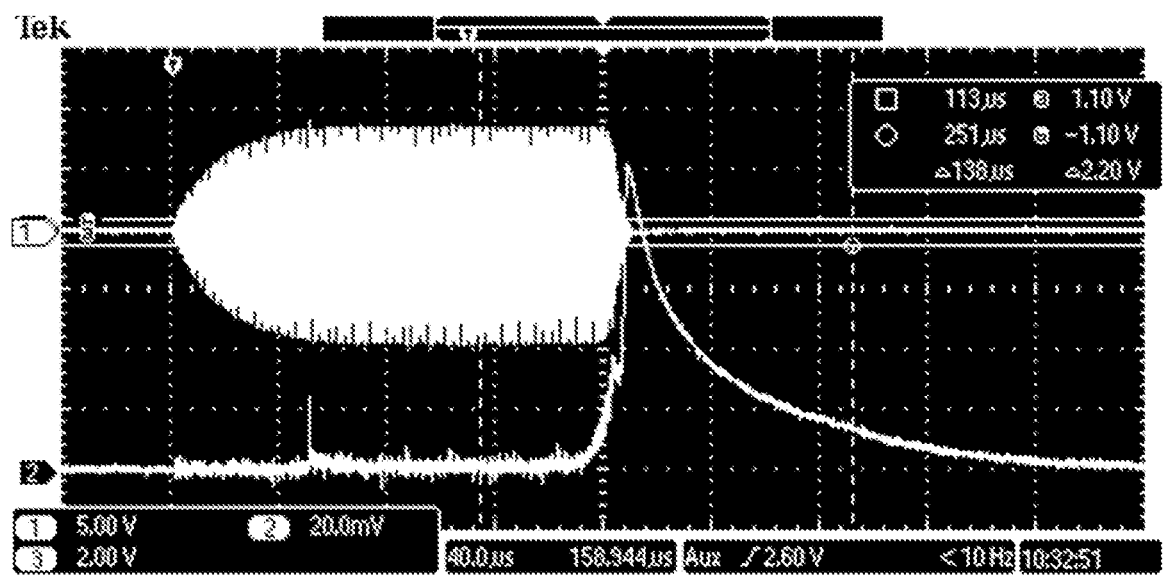

FIG. 9 show computer simulation results with breakdown delay time as a function of azimuthal electrical strength of the antenna for gas pressure in argon using 1 MHz RF power. More particularly, FIG. 9 shows breakdown delay time as a function of azimuthal electrical field strength of the antenna for gas pressure in argon using 1 MHz RF power. The results are from a one-dimensional particle-in-cell (PIC) simulation with Monte Carlo collision (MCC) treatment for electron gas collisions including ionization, excitation, and elastic momentum and energy transfer collision. A XPDC1 code, described in J. P. Verboncoeur, M. V. Alves, V. Vahedi, and C. K. Birdsall, J. Comput. Phys. 104(2), 321 (1993), was used for the PIC-MCC simulation for a one-dimensional radial slice of a cylindrical RF pulsed discharge reactor with a single turn coil antenna for a 1.5 cm reactor radius and 9.4 cm azimuthal circumference. In order to include the effect of the azimuthal electric field for inductively coupled discharges, Maxwell's equations are solved for the azimuthal electric field with the plasma conductivity and coupled to the PIC-MCC simulation as reported by Lee and Verboncoeur (described in H. J. Lee and J. P. Verboncoeur, Phys. Plasmas 9(11), 4804 (2002). In this simulation, only the initial breakdown phase was considered, and thus the evolution of excited states and the radiation transport were neglected. The simulation starts with an initially uniform plasma density of $1 \times 10^6$ cm$^{-3}$ in the reactor volume and the breakdown is defined when the plasma density is increased by 1,000 folds to $1 \times 10^9$ cm$^{-3}$ from the avalanche ionization with the energy transfer from the RF electric fields to the plasma. In order to save the computation time, the maximum breakdown delay time is chosen at 10 µs. As described above, rapid breakdown is important for pulsed RF plasma source operation. The data points indicating 10 µs breakdown delay time are the case when no breakdown is achieved within the first 10 µs after the RF power is applied to the system. The results from the computer simulation agree in general with the Paschen curve for argon shown in FIG. 8.

FIGS. 10A-10D shows the time history of rf pulsed plasma generation at four different gas pressures of argon, 1.2 torr, 3.2 torr, 6.5 torr and 9.8 torr. The rf voltage on the antenna is shown by trace 1, which is measured using high voltage probe with 1,000× voltage division. The rf current across the antenna is shown using trace 3, which is measured using Pearson current monitor with 1 kA/1V sensitivity. The plasma light emission is shown using trace 2, which is measured by a fast photodiode with 50 ohm termination. The reactor size is 48 mm diameter and an 8-turn antenna was constructed with the high voltage insulated 12 gauge wire, resulting in a vacuum inductance of 4 µH. Rf switching power system operates with the switch voltages of +130 V and −130V at the IGBT switches in a half bridge configuration. With the use of 10 nF high voltage tuning capacitor, the rf switching frequency was chosen at 800 kHz and no dynamic tuning was performed after breakdown. Once the rf switching system is turned on, it takes approximately 50 µs to reach a peak rf voltage of 16 kV, a peak to peak value, at the antenna. It is note that this turn on time for the series circuit can be controlled and reduced by adjusting the maximum IGBT surge current. After the series resonance circuit reaches its peak voltage, the breakdown occurs in the reactor from the electron avalanche. At 1.2 torr, the delay time is only 7 µs, while it increases to 20 µs at 3.2 torr, 53 µs at 6.5 torr, 100 µs at 9.8 torr, showing the technical challenge related to the rapid high pressure gas breakdown using rf pulse power. After the breakdown, the discharge can be sustained by maintaining rf pulse power to the antenna. Thus, the pulse plasma duration can be easily programmed by controlling the total pulse duration using the following relation, $t_{plasma} = t^{rf}_{total} - t^{rf}_{charging} - t_{breakdown}$, where $t_{plasma}$ is the pulse plasma duration, $t^{rf}_{total}$ is the total duration of rf switching circuit, $t^{rf}_{charging}$ is the initial series resonance charging time, and $t_{breakdown}$ is the time delay of gas breakdown. It is noted that the plasma loading changes the resonance circuit property after breakdown and the detuning of resonance is observed from the significant reduction in antenna voltage and current. As discussed previously, it is possible to re-tune the resonance circuit by adjusting the rf frequency of the switching power supply though we did not attempted dynamic tuning of the rf switching supply in this figure.

FIGS. 11A-11C show examples of a resonance circuit that may be used in the pulsed plasma reactor. Specifically, FIG. 11A shows an example of a serial resonance circuit 1100 that may be used to generate the pulsed RF power to the antenna. The series resonance circuit 1100 may include RF power 1102, a series capacitor Cs 1104, an RF antenna Ls 1106 and a resistor Rs 1108 (for plasma loading and parasitic resistance) that are interconnected to each other in series as shown in FIG. 11A.

FIG. 11B shows an example of a parallel resonance circuit 1110. The parallel resonance circuit 1110 may include RF power 1112, a parallel capacitor Cp 1114, an RF antenna Ls 1116 and a resistor Rp 1118 (for plasma loading and parasitic resistance) in which the capacitor Cp, antenna and resistor are connected in parallel to the RF power.

FIG. 11C shows an example of a hybrid resonance circuit 1120 that has one RF power source and two antennas ($R_{s,\,plasma}$ and $R_{p,\,plasma}$). The hybrid resonance circuit 1120 may include RF power 1122, a parallel capacitor Cp 1124 in parallel with the RF power, parallel RF antenna Lp 1126 for plasma sustainment and resistor Rp 1128 in series with each other and in parallel with the RF power and the capacitor. The hybrid resonance circuit 1120 may also include a series capacitor Cs 1130 and Ls and $R_{plasma}$ in series with each other and both in parallel with the RF power. In the hybrid resonance circuit, an initial breakdown occurs via the series resonance network using the first antenna and the plasma sustainment occurs via the parallel resonance network using the second antenna.

While the foregoing has been with reference to a particular embodiment of the invention, it will be appreciated by those skilled in the art that changes in this embodiment may be made without departing from the principles and spirit of the disclosure, the scope of which is defined by the appended claims.

FIG. 1A. Pulsed RF plasma reactor.
101: Inlet for carrier gas and precursor materials.
102: Plasma reactor operating at 5-2,000 torr.
103: Pulsed plasmas generated by pulsed rf power to the antenna.
104: Gas exhaust port.
105: Valve for gas pumping.
106: Vacuum pump.
107: RF antenna for inductive plasma generation.
108: RF pulsed power system.
109: RF pulse waveform from the RF pulsed power system.
FIG. 1B. Cutaway view of FIG. 1A.
110: Inlet for carrier gas and precursor materials.
111: Plasma reactor operating at 5-2,000 torr.
112: RF antenna for inductive plasma generation.
113: Gas exhaust port.
FIG. 2. Pulsed RF plasma reactor with two inlets.
201: Inlet for precursor materials.
202: Plasma reactor operating at 5-2,000 torr.
203: Pulsed plasmas generated by pulsed rf power to the antenna.
204: Gas exhaust port.
205: Valve for gas pumping.
206: Vacuum pump.
207: RF antenna for inductive plasma generation.
208: RF pulsed power system.
209: RF pulse waveform from the RF pulsed power system.
210: Inlet for carrier gas.
FIG. 3A. Pulsed RF plasma reactor with a substrate inside reactor.
301: Inlet for precursor materials.
302: Plasma reactor operating at 5-2,000 torr.
303: Pulsed plasmas generated by pulsed rf power to the antenna.
304: Gas exhaust port.
305: Valve for gas pumping.
306: Vacuum pump.
307: Substrate to be treated by the reactive materials activated the rf pulsed plasma.
308: RF antenna for inductive plasma generation.
309: RF pulsed power system.
310: RF pulse waveform from the RF pulsed power system.
311: Inlet for carrier gas.
FIG. 3B. Pulsed RF plasma reactor with the moveable substrate system.
312: Inlet for precursor materials.
313: Plasma reactor operating at 5-2,000 torr.
314: Pulsed plasmas generated by pulsed rf power to the antenna.
315: Gas exhaust port.
316: Valve for gas pumping.
317: Vacuum pump.
318: Substrate transport system.
319: Vacuum load lock which allows a large substrate to move in and out of the rf pulsed plasma reactor without affecting the operating gas pressure in the reactor.
320: Substrate to be treated by the reactive materials activated the rf pulsed plasma. Large objects such as glass panel can be treated in this manner.
321: RF antenna for inductive plasma generation.
322: RF pulsed power system.
323: RF pulse waveform from the RF pulsed power system.
324: Inlet for carrier gas.
FIG. 4. Pulsed RF plasma reactor with material collection systems.
401: Inlet for precursor materials.
402: Plasma reactor operating at 5-2,000 torr.
403: Pulsed plasmas generated by pulsed rf power to the antenna.
404: Functional materials synthesized from precursor materials inside the pulsed rf plasma reactor. Examples include nanoparticles, nanofibers, nanowires, nanocrystals such as quantum dots and nanophosphors.
405: Gas exhaust port.
406: Valve for gas pumping.
407: Vacuum pump.
408: Materials collection system.
409: Nano and microscale filters and mesh to capture functional materials.
410: RF antenna for inductive plasma generation.
411: RF pulsed power system.
412: RF pulse waveform from the RF pulsed power system.
413: Inlet for carrier gas.
FIG. 5. Pulsed RF plasma reactor with dynamic rf frequency tuning.
501: Inlet for carrier gas and precursor materials.
502: Plasma reactor operating at 5-2,000 torr.
503: Pulsed plasmas generated by pulsed if power to the antenna.
504: Gas exhaust port.
505: Valve for gas pumping.
506: Vacuum pump.
507: RF antenna for inductive plasma generation.
508: RF pulsed power system.
509: Frequency modulated RF pulse waveform from the RF pulsed power system. Typically, one frequency will be used to breakdown and the other frequency will be used after breakdown.
FIG. 6A. Pulsed RF plasma reactor with dual rf power systems.
601: Inlet for carrier gas and precursor materials.
602: Plasma reactor operating at 5-2,000 torr.
603: Pulsed plasmas generated by pulsed rf power to the antenna.
604: Gas exhaust port.
605: Valve for gas pumping.
606: Vacuum pump.
607: Main RF antenna for plasma sustainment.
608: Main RF pulsed power system for plasma sustainment.
609: RF pulse waveform from the main RF pulsed power system. The pulse duration on the main RF pulse power will be longer than the Ignition RF pulsed power system.
610: Ignition RF antenna for gas breakdown.
611: Ignition RF pulsed power system for gas breakdown.

612: RF pulse waveform from the ignition RF pulsed power system. The ignition RF pulse power will be turned off after the plasma ignition.
FIG. 6B. Cutaway view of FIG. 6A.
613: Inlet for carrier gas and precursor materials.
614: Plasma reactor operating at 5-2,000 torr.
615: Gas exhaust port.
616: Main RF antenna for plasma sustainment.
617: Ignition RF antenna for gas breakdown.
FIG. 6C. Pulsed RF plasma reactor with dual antennas and one rf pulse power system.
618: Inlet for carrier gas and precursor materials.
619: Plasma reactor operating at 5-2,000 torr.
620: Pulsed plasmas generated by pulsed rf power to the antenna.
621: Gas exhaust port.
622: Valve for gas pumping.
623: Vacuum pump.
624: Ignition RF antenna for gas breakdown.
625: Main RF antenna for plasma sustainment.
626: RF pulsed power system for plasma breakdown and sustainment, which may utilize hybrid resonance circuit in FIG. 11C.
627: RF pulse waveform from the RF pulsed power system
FIG. 7A-E. Open end plasma spray using rf pulsed plasma activation of precursor materials and its operation principle.
701: Inlet for precursor materials.
702: Plasma reactor operating at 5-2,000 torr.
703: Gas exhaust port.
704: Valve for gas pumping.
705: Vacuum pump.
706: Target surface located outside the reactor in an ambient pressures.
707: Nozzle exit valve—closed for pumping and plasma generation and open for activated materials exhaust onto the target surface.
708: Plasma spray nozzle.
709: RF antenna for inductive plasma generation.
710: RF pulsed power system.
711: Frequency modulated RF pulse waveform from the RF pulsed power system.
712: Inlet for carrier gas.
713: Pulsed plasmas generated by pulsed rf power to the antenna.
714: Plasma plume containing activated material from precursors. When the plasma plume reaches the target surface, thermally and chemically activated materials from precursors can react with the target surface for material deposition and coating, surface removal, surface activation and surface property modification.

The invention claimed is:
1. A method for generating plasma in a reactor chamber that contains a carrier gas and one or more reactive precursors with a pressure of between 1 torr and 2,000 torr, the method comprising:
generating, by a pulsed radio frequency source that is driven with a pulse duration that is less than 10 ms, a pulsed radio frequency signal having a radio frequency of less than 10 MHz;
delivering the pulsed radio frequency signal to an inductive antenna coupled to the pulsed radio frequency source and surrounding the reactor chamber;
initiating, by the pulsed radio frequency signal delivered to the inductive antenna, a breakdown of the carrier gas and one or more reactive precursors in the reactor chamber to generate a plasma;
generating a plasma in the reactor chamber by the breakdown of the carrier gas and one or more reactive precursors in the reactor chamber;
exhausting, by a material exhaust system connected to the reactor chamber, the material flow from one or more activated reactive precursors out of the reactor chamber; and
directing, using a nozzle, a flow of one or more reactive precursors onto a target surface located outside the reactor chamber in an ambient pressure so that the target surface and the one or more reactive precursors are activated by the plasma when the target surface is in the reactor chamber.

* * * * *